US012652757B2

(12) United States Patent
Sumanam et al.

(10) Patent No.: US 12,652,757 B2
(45) Date of Patent: Jun. 9, 2026

(54) IMPEDANCE MATCHED VIA CONNECTIONS IN A PRINTED CIRCUIT BOARD

(71) Applicant: The Phoenix Company of Chicago, Inc., Naugatuck, CT (US)

(72) Inventors: Sri Satya Parthiva Sumanam, Naugatuck, CT (US); Salvatore J. Gullotta, Sr., Naugatuck, CT (US)

(73) Assignee: The Phoenix Company of Chicago, Inc., Naugatuck, CT (US)

( * ) Notice: Subject to any disclaimer, the term of this patent is extended or adjusted under 35 U.S.C. 154(b) by 453 days.

(21) Appl. No.: 17/895,247

(22) Filed: Aug. 25, 2022

(65) Prior Publication Data

US 2024/0074054 A1 Feb. 29, 2024

(51) Int. Cl.
H05K 1/11 (2006.01)
H05K 1/02 (2006.01)
*H05K 1/18* (2006.01)

(52) U.S. Cl.
CPC .......... H05K 1/115 (2013.01); H05K 1/0251 (2013.01); H05K 1/0296 (2013.01); *H05K 1/0222* (2013.01); *H05K 1/18* (2013.01); *H05K 2201/0776* (2013.01); *H05K 2201/10189* (2013.01)

(58) Field of Classification Search
CPC ................ H05K 1/115; H05K 1/0296; H05K 2201/0776; H05K 1/0222; H05K 2201/10189; H05K 1/0251
See application file for complete search history.

(56) References Cited

U.S. PATENT DOCUMENTS

| | | | | |
|---|---|---|---|---|
| RE32,691 E | * | 6/1988 | Dola ................... | H01R 12/716 |
| | | | | 439/607.11 |
| 5,060,373 A | | 10/1991 | Machura et al. | |
| 5,120,258 A | * | 6/1992 | Carlton ................. | H01R 24/50 |
| | | | | 439/63 |
| 5,425,816 A | | 6/1995 | Cavicchi | |
| 5,823,790 A | * | 10/1998 | Magnuson ............. | H01R 24/50 |
| | | | | 333/260 |
| 6,077,087 A | * | 6/2000 | Endres ................... | H01R 24/50 |
| | | | | 439/63 |

(Continued)

FOREIGN PATENT DOCUMENTS

CN          114828399          7/2022

*Primary Examiner* — Ishwarbhai B Patel
(74) *Attorney, Agent, or Firm* — Robert Curcio; DeLio Peterson & Curcio LLC

(57) ABSTRACT

Vertical launch impedance matched through-hole vias to ensure proper impedance matching is maintained after a printed circuit board connector is attached to a printed circuit board. A conductive via having a center aperture and a via body having a slot adjacent either the via top surface and/or via bottom surface, and a dielectric component insertable within the via center aperture, and having a slot aligned with the conductive via body slot. The dielectric component having a center aperture with a conductive member in electrical communication with a PCB signal trace without contact to the conductive via. A printed circuit board connector having a center signal pin with a slotted dielectric component attached thereto, or a slotted dielectric component in conjunction with a slotted, conductive via body attached thereto.

30 Claims, 26 Drawing Sheets

(56)                    References Cited

U.S. PATENT DOCUMENTS

| | | | | |
|---|---|---|---|---|
| 6,079,986 A * | 6/2000 | Beshears | ............... | H01R 12/52 |
| | | | | 439/63 |
| 7,404,250 B2 * | 7/2008 | Cheng | ................. | H05K 1/0222 |
| | | | | 29/850 |
| 8,035,038 B2 | 10/2011 | Cheng et al. | | |
| 2004/0069529 A1 | 4/2004 | Oggioni et al. | | |
| 2004/0106304 A1 * | 6/2004 | Lin | ....................... | H01R 24/50 |
| | | | | 439/63 |
| 2007/0124930 A1 | 6/2007 | Cheng et al. | | |
| 2009/0133913 A1 | 5/2009 | Kushta et al. | | |
| 2011/0061233 A1 | 3/2011 | Martinez-Vargas et al. | | |
| 2019/0164908 A1 | 5/2019 | Lee et al. | | |
| 2022/0029363 A1 | 1/2022 | Bednarz et al. | | |
| 2022/0240375 A1 * | 7/2022 | Chen | ................... | H05K 3/0026 |

* cited by examiner 10        12        14        16        18

IMPEDANCE MATCHED VIA CONNECTIONS IN A PRINTED CIRCUIT BOARD

BACKGROUND OF THE INVENTION

1. Field of the Invention

The present invention relates generally to vias in printed circuit boards for electrically coupling electrical signals between conductive layers of the printed circuit boards. More specifically, the present invention relates to vertical launch impedance matched vias, and designs thereof to ensure proper impedance matching is maintained after a component is attached to a printed circuit board.

2. Description of Related Art

Vias play a role as conductors connecting traces across different layers of a multi-layer PCB (Printed Circuit Board). Vias can be used in various applications. In one such application, an electrical signal must propagate or transition from a first conductive layer through a via to one or more other conductive layers in the PCB. An electrical signal transitioning through a via must have a low magnitude of reflection or low return loss to minimize errors in the signal. Due to the intrinsic geometrical difference between a via and its connected traces, there exists impedance mismatch at the via transition. As circuit switching speed dramatically increases into the multi-Gbps range, and the physical size of the circuit continues to shrink, this via impedance mismatch poses a serious problem.

In the case of low frequency signals, vias generally have a minimal effect on signal transmission. However, as frequency rises and the signal rising edge becomes steep (e.g., on the order of 1 nanosecond), vias may not be regarded solely as a function of electrical connection; rather, influence of vias on signal integrity has to be carefully considered. Vias behave as breakpoints with discontinuous impedance introduced in transmission line propagation causing signal reflections. Moreover, as the frequency increases, the electrical length of a via impedance mismatching section becomes longer in relation to the signal and poses a more serious problem at higher frequency ranges. An impedance discontinuity at the junction of a via and an interconnect line creates signal reflections and contributes to the loss of the signal. Thus, it is necessary for via construction to consider and accommodate impedance matching to address potential signal degradation.

Impedance matching is designing source and load impedances to minimize signal reflection or maximize power transfer. These reflections cause destructive interference, leading to peaks and valleys in the signal quality. In DC circuits, the source and load should be equal. In AC circuits, the source should either equal the load or the complex conjugate of the load, depending on the goal. Impedance matching challenges RF and microwave circuit design because the window for error should decrease as the frequency increases. High speed digital circuits require very stable controlled impedances because of the impact on bit error rate and the potential for pulse distortion, reflection, and electromagnetic interference.

FIG. 1 depicts a typical electrical schematic of an impedance matching network having impedance Z in electrical communication with a source impedance, $Z_s$, and a load impedance, $Z_L$. Impedance matching is important to obtain a desirable loss response (return and insertion).

FIG. 2 depicts the different types of via placements that may be established within a printed circuit board utilizing the via design of the present invention. In this illustrative example, shown are through-hole via 10, blind via 12, buried via 16, staggered vias 14 (combination of 12 and 16), which may be microvias, and a stacked, buried via 18. The different embodiments of the slotted bodies and slotted dielectric components of the present invention can be situated in any number of the via locations presented in FIG. 2.

FIG. 3 depicts an isometric view of an End Launch Connection 20, the current state of the art for matching the impedance of a component to a PCB for high frequency performance. Component 22 is typically mounted on the edge of the PCB 24 with ground legs 26 extended onto the PCB 24, which typically act as ground (or zero potential) points of contact. A center signal contact extension 28 traverses onto the PCB signal trace 30 portion of the PCB. The center contact signal extension 28 and grounded legs 26 are designed with the PCB ground and PCB signal trace 30 to achieve matched impedance enabling high frequency performance. This design acts in a manner similar to a coaxial connection scheme. The PC board separates the signal line 30 from the ground legs 26.

The connection depicted in FIG. 3 (end launch) limits the connector density (number of connectors) available on a board. Essentially, PCB edge real estate is limited, thus limiting the number of end launch connections. In order to make electrical connection for this type of connector, soldering is performed on top of the center and ground contact extensions. Ultimately, this style of connector design provides for a weaker connection bond to the PCB.

A second configuration known in the art to attach a connector to a PCB is a Vertical Launch Connection Via. FIG. 4A depicts a top view of a PCB 32 having through-hole vias 34 and a connecting trace 36, electrically connecting the signal line associated with each via, illustrating a vertical launch connection via.

FIG. 4B depicts a perspective view of the PCB of FIG. 4A having PCB connectors attached to the PCB using a through-hole attachment. Connectors 38 include a center contact pin 40 and a connection to a PCB signal line on PCB substrate 32. The via consists of a plated, conductive through-hole 42 and a center contact pin 40. The center contact pin 40 is ultimately in electrical communication with the PCB signal line 36 by way of a trace signal to the via. Ground legs 44 extend in the same direction as the center contact pin 40. In the design, the center contact pin 40 is mounted inside, and preferably coaxial with, the via, connecting PCB signal line 36 in a vertical or perpendicular mount (perpendicular to the PCB top surface). Soldering is performed inside the via between the center contact pin 40 and plated via through-hole. Through the via connection, center contact pin 40 is electrically linked to the PCB signal line 36.

FIG. 4C depicts a partial cross-sectional view of the contact interface between a vertical launch via of FIGS. 4A and 4B and a PCB connector.

Vertical launch connection schemes increase the connector density over end launch connection schemes, and generally create a stronger connection bond with the PCB.

Generally, every PCB is designed for matched impedance between the PCB and the device connected to it. However, through-hole connectors often fail to maintain matched impedance when installed on a PCB. Both the connector and the board are individually designed to have matched impedance, but when the connector is installed on the PCB after soldering, the resultant impedance is not a matched impedance. Undesirable signal loss (higher return and insertion losses) at a given (generally higher) frequency will occur and continue to degrade as signal frequency increases.

SUMMARY OF THE INVENTION

Bearing in mind the problems and deficiencies of the prior art, it is therefore an object of the present invention to provide a vertical launch impedance-matched, conductive, slotted via body for insertion within a PCB, and a dielectric component also having a slotted portion aligned with the via body slot, for receiving a conductive PCB trace without contact to the conductive via.

It is another object of the present invention to provide designs for the impedance-matched via that includes connection schemes for extended contact pins or extended contact sockets. Such designs may include the implementation of a connector (which may also be a PkZ® connector).

A further object of the invention is to provide a design for a PCB connector having either a slotted dielectric component attached to a PCB connector extended contact pin or a combination of a slotted conductive via body with a slotted dielectric component attached to the PCB connector.

The above and other objects, which will be apparent to those skilled in the art, are achieved in the present invention which is directed to in a first aspect, an apparatus for conducting an electrical signal between a first conductive strip of a printed circuit board and a printed circuit board connector, the apparatus comprising: a via having a via body defining an inside wall, an outside wall, a top surface, and a bottom surface, wherein the inside wall forms a via body center through-hole, and wherein the via body includes an aperture or slot adjacent either the via body top surface or via body bottom surface, or the via body includes at least two apertures or slots, wherein a first aperture or slot is adjacent the via body top surface and a second aperture or slot is adjacent the via body bottom surface; and a dielectric component having a body defining a dielectric component inside wall, an outside wall, a top surface, and a bottom surface, the dielectric component body sized for insertion within the via body center through-hole, the dielectric component body including a center through-hole coaxial with the via center through-hole, and wherein the dielectric component body includes an aperture or slot adjacent either the dielectric component top surface or dielectric component bottom surface, or the dielectric component body includes at least two apertures or slots, wherein a first dielectric component aperture or slot is adjacent the dielectric component top surface and a second dielectric component aperture or slot is adjacent the dielectric component bottom surface; such that the via body aperture or slot is aligned with the dielectric component aperture or slot when the dielectric component is inserted within the via center through-hole.

The via body and the dielectric component may be mounted within the printed circuit board. The dielectric component may include a plurality of dielectric materials.

The via body may be cylindrical having an outer diameter, having a ring on the via body bottom surface or the via top surface or both, the ring having an outer diameter greater than the via body outer diameter, such that the ring extends beyond the via body outer diameter in a radial direction.

The via body may include conductive material, such that the via body is capable of carrying electrical current. The via body may also be formed of a non-conductive material plated with the conductive material.

The via body may be fabricated during PCB fabrication on a layer-by-layer basis and/or the dielectric component may be placed within the via body during the PCB fabrication.

The via body and the dielectric component can be situated within the PCB such that top and bottom surfaces of the via body and the dielectric component are not exposed to both a top surface of the PCB and a bottom surface of the PCB.

Additionally, the via body and the dielectric component may be situated within the PCB such that a top surface of the via body and the dielectric component are not exposed to a top surface of the PCB, or a bottom surface of the via body and the dielectric component are not exposed to a bottom surface of the PCB.

In a second aspect, the present invention is directed to a printed circuit board connector having a bottom surface for connection to a printed circuit board, the connector comprising: a connector center conductor for transmitting an electrical signal; a dielectric component having a body defining a dielectric component inside wall, an outside wall, a top surface, and a bottom surface, the dielectric component body including a center through-hole, wherein the connector center conductor is inserted within the dielectric component body center aperture or through-hole.

The dielectric component body may include an aperture or slot adjacent either the dielectric component top surface or bottom surface or both.

The printed circuit board connector may further include a conductive via body defining an inside wall, an outside wall, a top surface, and a bottom surface, wherein the inside wall forms a via through-hole.

The printed circuit board connector may include a conductive via body defining an inside wall, an outside wall, a top surface, and a bottom surface, wherein the inside wall forms a via through-hole, wherein the via body includes an aperture or slot adjacent either the via body top surface or via body bottom surface or both, such that the dielectric component body is situated within the via body center through-hole, and wherein the via body aperture or slot is aligned with the dielectric component aperture or slot when the dielectric component is inserted within the via center through-hole.

In a third aspect, the present invention is directed to a printed circuit board electrical connection assembly comprising: a printed circuit board (PCB) having a top surface, a bottom surface, and an interior therebetween, wherein the PCB includes a signal line and a ground or zero potential contact or line; a via insertable within or formed within the PCB, the via having a via body defining an inside wall, an outside wall, a top surface, and a bottom surface, wherein the inside wall forms a via center through-hole, and wherein the via body includes an aperture or slot adjacent either the via body top surface or via body bottom surface, or the via body includes at least two apertures or slots, wherein a first aperture is adjacent the via body top surface and a second aperture is adjacent the via body bottom surface, wherein the via body is conductive for transmitting electrical signals or for providing a ground or zero potential, and wherein the via body extends into the PCB interior; and a dielectric component having a body defining a dielectric component inside wall, an outside wall, a top surface, and a bottom surface, the dielectric component body sized for placement within the via body center through-hole, the dielectric component body including a center through-hole coaxial with the via center through-hole, and wherein the dielectric component body includes an aperture or slot adjacent either the dielectric component top surface or dielectric component bottom surface, or the dielectric component body includes at least two apertures, wherein a first dielectric component aperture is adjacent the dielectric component top surface and a second dielectric component aperture is adjacent the dielectric component bottom surface, and wherein the dielectric component apertures align with the via body apertures when the dielectric component is inserted within the via body center through-hole; and a conductive trace and/or solder bridge formed on or within the PCB and traversing through the dielectric component aperture or slot and through the via body aperture or slot to the dielectric component center through-hole without making electrical contact with the via body.

In a fourth aspect, the present invention is directed to a printed circuit board connection assembly for conducting an electrical signal between a conductive strip of a printed circuit board and a printed circuit board connector, the assembly comprising: a printed circuit board (PCB) having a top surface, a bottom surface, and an interior therebetween, wherein the PCB includes a signal trace and/or a ground trace; a via having a body defining an inside wall, an outside wall, a top surface, and a bottom surface, wherein the via body inside wall forms a via body center through-hole, and wherein the via body includes an aperture or slot adjacent either the via body top surface or via body bottom surface or both, and wherein at least a portion of the via body is electrically conductive; and a dielectric component having a body defining an inside wall, an outside wall, a top surface, and a bottom surface, the dielectric component body sized for placement within the via body center through-hole, the dielectric component body including a center through-hole coaxial with the via body center through-hole, the dielectric component center through-hole supporting a conductive member, wherein the dielectric component body includes an aperture or slot adjacent either the dielectric component top surface or bottom surface or both, and wherein the via body aperture or slot is aligned with the dielectric component aperture or slot when the dielectric component is placed within the via body center aperture; a conductive trace and/or solder bridge formed on or within the PCB and traversing through the dielectric component aperture or slot and the via body aperture or slot to the dielectric component center through-hole without making contact with the via body, and in electrical communication with the dielectric component center through-hole conductive member.

In a fifth aspect, the present invention is directed to a printed circuit board (PCB) connector assembly having a plurality of PCB connectors, each having a bottom portion for connection to a printed circuit board, at least one of the plurality of PCB connectors comprising: a connector center conductor for transmitting an electrical signal; a dielectric component having a body defining a dielectric component inside wall, an outside wall, a top surface, and a bottom surface, the dielectric component body including a center through-hole, wherein the connector center conductor is located within the dielectric component body center aperture or through-hole.

At least one connector within the plurality of PCB connectors includes a PkZ® connector.

The dielectric component body may include an aperture or slot adjacent either the dielectric component top surface or bottom surface or both.

The PCB connector may further include a conductive via body defining an inside wall, an outside wall, a top surface, and a bottom surface, wherein the inside wall forms a via through-hole.

The conductive via body defines an inside wall, an outside wall, a top surface, and a bottom surface, wherein the inside wall forms a via through-hole, wherein the via body includes an aperture or slot adjacent either the via body top surface or via body bottom surface or both, such that the dielectric component body is situated within the via body center through-hole, and wherein the via body aperture or slot is aligned with the dielectric component aperture or slot when the dielectric component is inserted within the via center through-hole.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
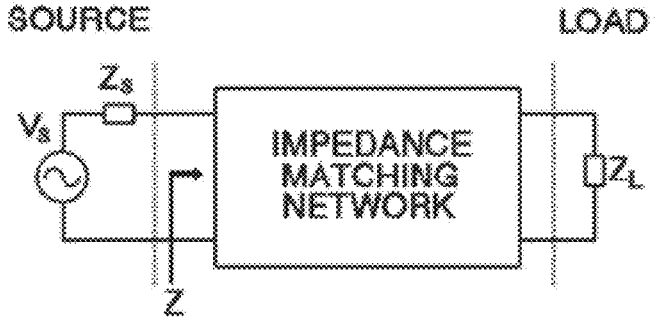
FIG. 1 depicts an electrical schematic of an impedance matching network having impedance Z in electrical communication with a source impedance, $Z_s$, and a load impedance, $Z_L$.
Figure 2:
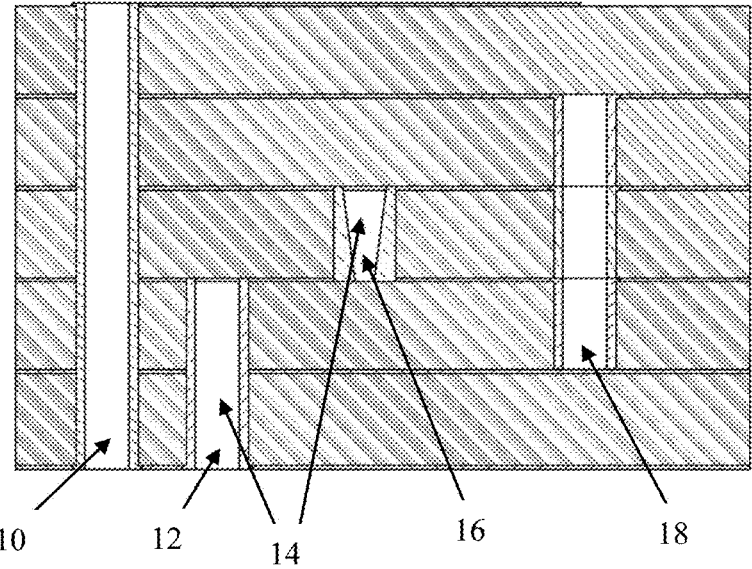
FIG. 2 depicts the different types of via placements that may be established within a printed circuit board utilizing the via design of the present invention.
Figure 3:
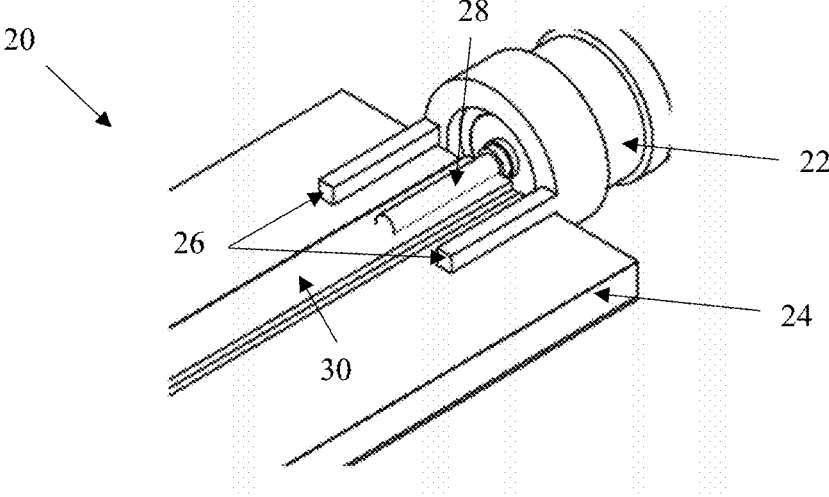
FIG. 3 depicts isometric view of the current state of the art of an end launch connection via.
Figure 4A:
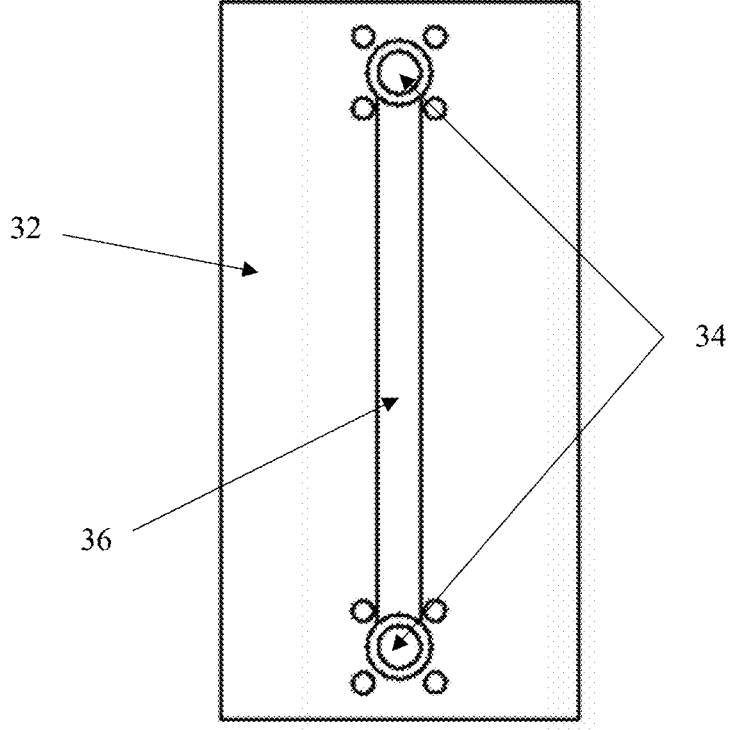
FIG. 4A depicts a top view of a PCB having through-hole vias and a connecting trace, electrically connecting either the ground or signal line associated with each via.
Figure 4B:
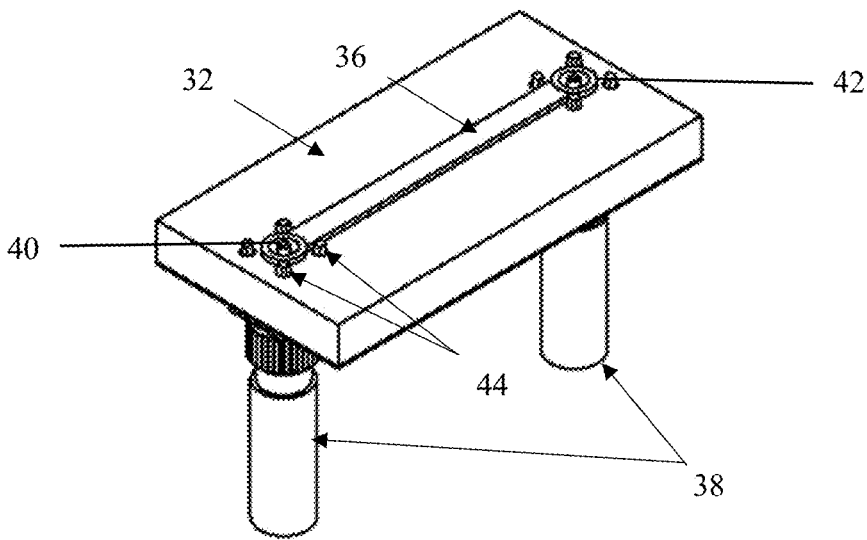
FIG. 4B depicts a perspective view of the PCB of FIG. 4A having connectors attached to the PCB using a through-hole attachment.
Figure 4C:
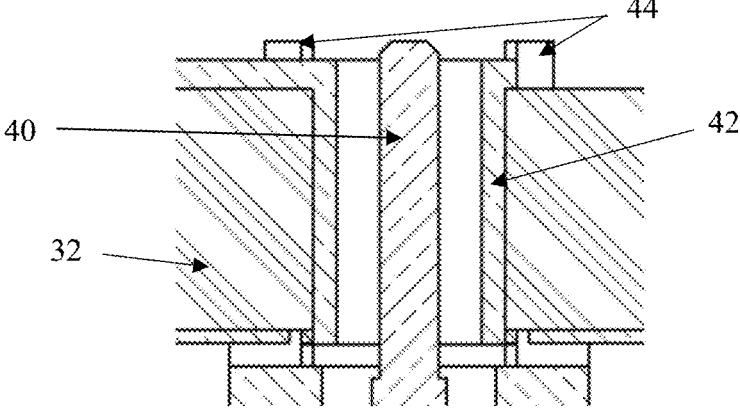
FIG. 4C depicts a partial cross-sectional view of the contact interface between a vertical launch via and a PCB connector.

In describing the preferred embodiment of the present invention, reference will be made herein to FIGS. 1-32 of the drawings in which like numerals refer to like features of the invention.

To mitigate the effects of a lossy connection, various via designs are presented. These via designs generally comprise a well-designed electrical insulating material, such as materials with dielectric properties, e.g., Teflon and the like, or materials which will assist after connection to maintain electrical separation, and an impedance match between the installed PCB connector and the PCB signal lines or traces. For this purpose, as will be discussed in greater detail below, a slotted through-hole via body is designed and a slotted dielectric is employed in conjunction therewith, where the slots are aligned. The slots are essentially holes or apertures in their respective components, that allow a gap or break in the components in order to effectuate signal transmission. Slots, holes, or apertures may be used interchangeably to describe this aspect of the "slotted" configuration forming the external portion of the slotted via body and/or slotted dielectric.

The purpose of the slots is to establish a connection bridge between the connector center signal pin and the signal line or trace on the PCB without shorting the signal to ground, and while maintaining a constant or near-constant impedance match. When the connector is placed perpendicular to the board into the via (e.g., in a vertical launch design) with a well-designed insulating material (dielectric), desired matched impedance (e.g., 33, 50, 75 ohms) can be readily achieved. To attain such a matched impedance circuit, the through-hole via diameter, insulating material, and connector pin configuration are calculated and adjusted.

The size of the via hole, and the material used for the via dielectric and/or pin or socket, are based on the impedance formula (for a single material dielectric):

$$Z = \frac{138 \times \log_{10}\left(\frac{D}{d}\right)}{\sqrt{\varepsilon_r}}$$

where,

Z is impedance in ohms;

D is the effective outer diameter of the dielectric;

d is the effective outer diameter of the connector center contact; and $\varepsilon_r$ is the relative permittivity of the dielectric.

The dielectric material may be chosen based on its efficiency for electrostatic fields and poor conductivity. There are many dielectric materials that can be used to create an impedance match, including in some instances, a dielectric produced by an air gap.

Connectors in a vertical launch construction can be mounted on the top or bottom of a PCB. Given the geometric construct, the attachment of a vertical launch connector is in a direction perpendicular to the PCB top (or bottom) surface with a via extending through the PCB surface. The center contact leg of the PCB connector makes electrical contact to a signal trace by way of the via. In a preferred embodiment, the via is conductive so that there is an electrical connection with the via and ground or zero potential. This conduction may be in the form of a conductive plating on an otherwise non-conductive surface of a component. The connector generally includes longitudinally extending legs which are inserted into the PCB, and which present mechanical stability for the attaching connector to the PCB, and may provide electrical connection to ground by way of ground vias or traces in the PCB. This design increases the number of connectors on a PCB versus an end launch connection scheme, and provides greater mechanical strength than end launch connectors.

Typically for a vertical launch connection, a signal trace and via are connected by design, wherein the connector center contact is either soldered within the via or electrically connected by other means, and the signal trace connects directly to the via as well. It is the via that makes electrical connection with the PCB signal trace. In contrast, in at least one embodiment of the present invention, distinguishing itself from the prior art, the via inner walls and signal trace are not in electrical contact. In such an embodiment, a slotted dielectric component surrounds the center contact pin of the PCB connector, electrically separating the center contact pin from the via inner wall. However, in order to achieve electrical contact between the center contact pin and the signal trace on the PCB, corresponding gaps, slots, or apertures are established in the via body and the dielectric respectively, which are then aligned upon installation.

Figure 5A:
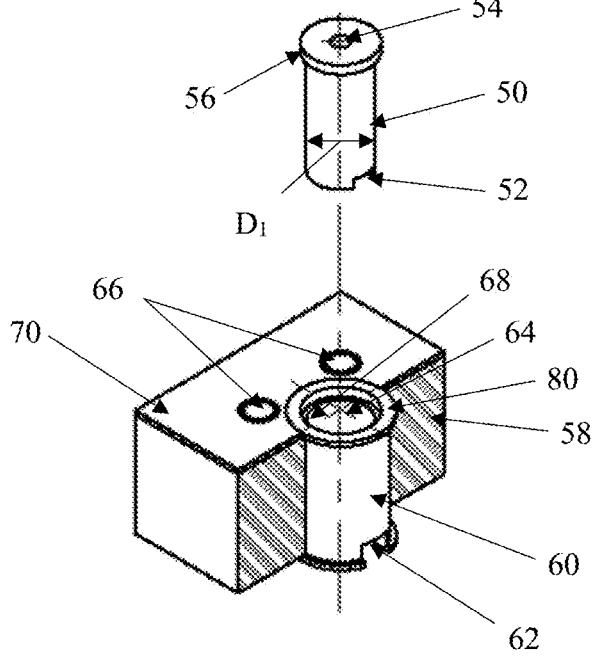
FIG. 5A depicts a partial, exploded, isometric view of a slotted via body with a slotted dielectric component.

FIG. 5A depicts a partial, exploded, isometric view of a slotted via body 60 forming the external portion of the via wall, receiving a slotted dielectric component 50. Dielectric component 50 includes a slot 52 adjacent its bottom, and exposed to the outer surface of the dielectric component sidewall. Slot 52 is designed to extend from this outside surface to a center, axial aperture 54, which traverses the axial length of dielectric component 50. Aperture 54 may hold a pin or socket contact, and is designed to receive a signal conductor (not shown) from a PCB connector.

Dielectric component 50 has a diameter $D_1$, and includes a cylindrical disc 56 formed on its top surface, and having a diameter greater than $D_1$, so that cylindrical disc 56 extends radially beyond the cylindrical body of dielectric component 50 that is insertable into the slotted via body 60. Within PCB 58 is a conductive, slotted via body 60, which may be formed during the PCB fabrication process or may be inserted as a solid construct. The conductive body may be formed of a non-conductive material, plated with a conductive coating. Slotted via body 60 includes a slot 62, which is ultimately aligned with slot 52 of dielectric component 50 upon insertion. Dielectric component 50 is inserted within, and coaxial with, slotted via body 60 center through-hole 64.

In this embodiment, generally a board designer would specify the dimensions of the components for impedance matching. In a preferred installation, the board designer/manufacturer would produce and assemble the embodiment of FIG. 5A, with the exception that the center signal pin and slotted dielectric component may be added in a later production process. Connector leg through holes 66 for mechanical support and ground connection are shown exposed on the top surface of PCB 58.

As depicted, the vias described herein, implementing the present invention, may be fabricated using printed circuit board technology stated in the art. Thus, it is possible for the via to be a single construct insertable within a PCB, or formed from a multitude of PCB layers during fabrication. In either manner, a slotted, conductive via body, capable of receiving a dielectric component, is the resultant configuration that can be utilized to practice embodiments of the present invention.

Slotted via body 60 is preferably plated with a conductive coating or fabricated of a solid conductive material. In the illustrative embodiment, the outer diameter of cylindrical disc or ring 56 is less than the inner diameter of the center through hole opening 64 of slotted via body 60, but greater than an inner diameter of an inner wall 68 of slotted via body 60, such that in at least one embodiment, cylindrical disc 56 is seated within an annular collar located at the top portion of slotted via body 60, allowing the dielectric component top surface to be approximately planar with the top surface 70 of PCB 58.

Figure 5B:
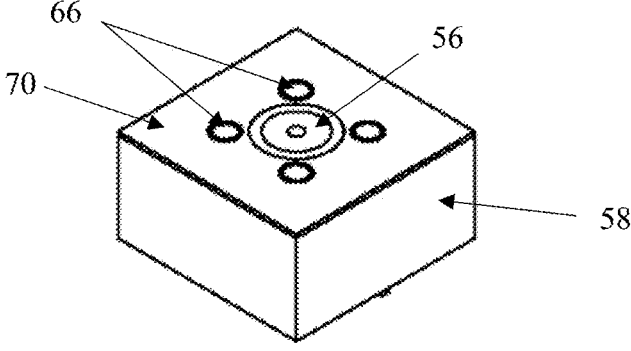
FIG. 5B is an assembled, perspective view of the PCB with slotted via body and slotted dielectric of FIG. 5A.

FIG. 5B is an assembled, perspective view of PCB 58 with the slotted via body 60 and slotted dielectric component 50 of FIG. 5A.

Figure 5C:
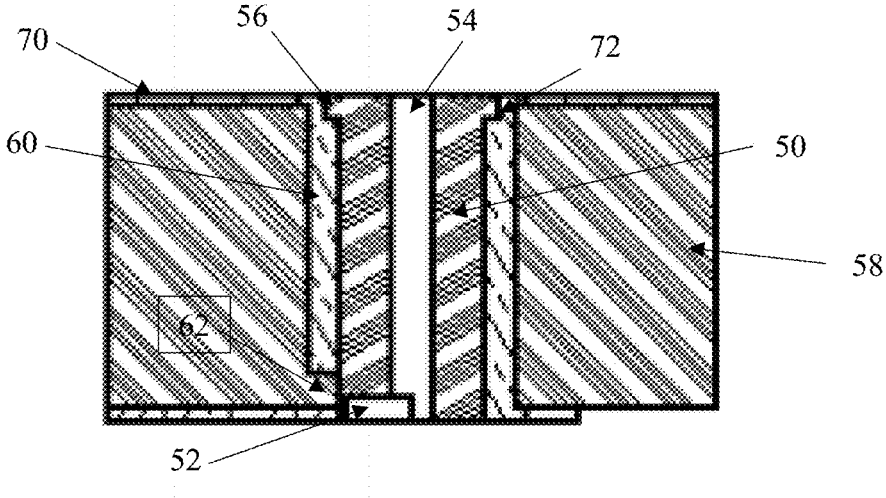
FIG. 5C is a cross-sectional view of the via design of FIG. 5B depicting the slotted via body and inner slotted dielectric component with a slot aligned with the slot of the via body.

FIG. 5C is a partial cross-sectional view of the via of FIG. 5B depicting the inner slotted dielectric component 50 with slot 52. As shown, slot 52 of dielectric component 50 is aligned with slot 62 of the conductive, slotted via body 60 to allow for an electrical connection, such as a solder bridge, to electrically connect to a signal line traversing channel or center aperture 54. Slotted via body 60 has a two-staged inner cylindrical wall forming different inner diameters one less than the other, such that shoulder or annular collar 72 is formed. Cylindrical disc (top ring) 56 of dielectric component 50 sits on annular collar 72 when dielectric component 50 is inserted within slotted via body 60, such that the exposed top surface of the slotted via body/dielectric component configuration is substantially flat with the PCB top surface 70.

Figure 6A:
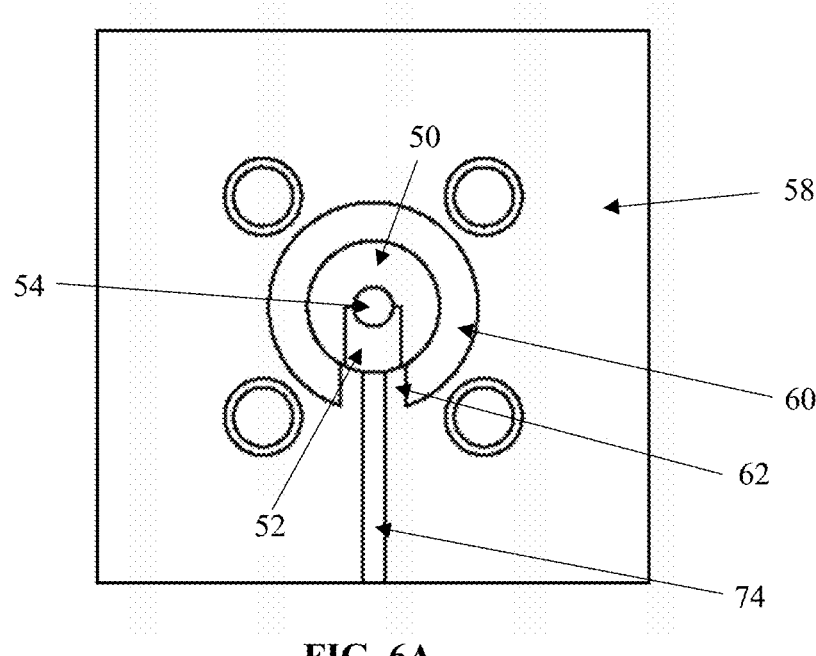
FIG. 6A depicts a signal line view of the PCB of FIG. 5C exposing the signal line side edge of the conductive, slotted via body and inner dielectric with a formed slot.

FIG. 6A depicts a signal line view of PCB 58 exposing the signal line side edge of slotted via body 60. The conductive via forms a circumferential ground component (ring about the cylindrical via) extending around the via through-hole 64 (FIG. 5A) and forming slot 62, which interrupts the circumferential path of the ground component at one end of the slotted via body. In this manner, a signal trace 74 is able to be in electrical communication with a center contact that is inserted within the via through-hole aperture 54 for a vertical launch connector. Electrical connection is made from signal trace 74 to a center contact (not shown) in aperture 54 through slots 52, 62 without touching the ground component conductive slotted via body 60. In most instances, as shown below, a connector or solder bridge will make electrical contact between the center contact and the signal trace.

In order for a center contact to work in this via embodiment, it must be coated or protected with an insulator, otherwise the center contact would be in electrical contact with the slotted via body inner wall, which would short circuit the signal line 74. This dielectric or insulating coating or covering must also include an uncovered portion or slotted portion 52 that coincides with the location of slot 62 to establish electrical connection of the center contact with the PCB signal trace. In different embodiments, this coating or covering is in the form of a cylindrical dielectric component having a center channel for receiving the center contact, and a slot preferably located at the signal line location of the dielectric component, aligned with a similar slot on the slotted via body, allowing for electrical contact from the center contact to a PCB trace line. A connection bridge is needed to connect one end of signal trace 74 to a center contact within aperture 54, through slots 52, 62.

Figure 6B:
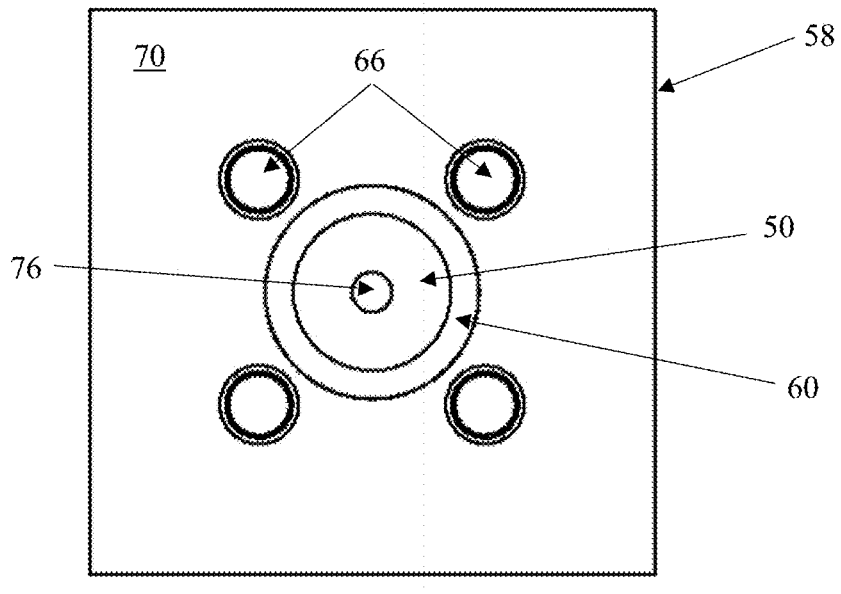
FIG. 6B depicts a ground plane view of the PCB of FIG. 6A, where the components are approximately flush with the top surface of the PCB.

FIG. 6B depicts a ground plane view of the PCB 58 of FIG. 6A, where the components are approximately flush with the top surface 70 of PCB 58. Apertures 66 for receiving mechanical support prongs of a PCB connector are also shown on the PCB top surface. The mechanical support prongs may also provide an electrical ground.

The aforementioned embodiment presents a slotted, electrically conductive via body, generally in electrical communication with ground or other reference potential, which is contrary to the prior art designs. The ground component (via body) may be depicted as a ring extending radially outwards away from the outer diameter of the cylindrical body of the dielectric component. This ring includes a gap or slot at least at one end to allow a trace line or connection bridge to traverse radially inwards towards a center contact located coaxial with the dielectric component.

Figure 7A:
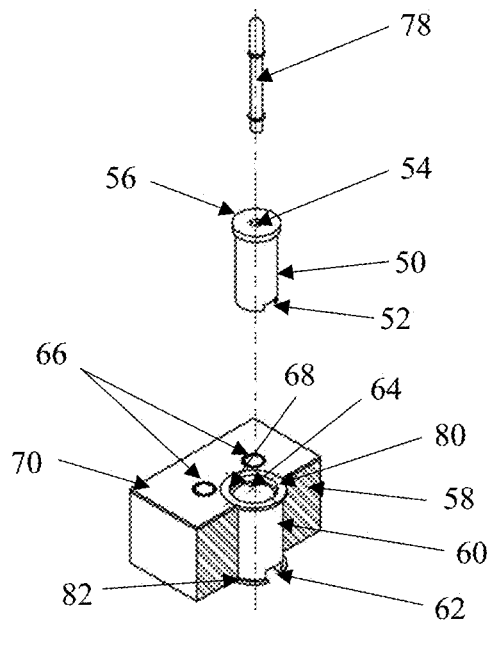
FIG. 7A is an exploded view of a signal pin contact within the PCB construct of FIG. 5A, wherein the signal pin contact is inserted within a slotted dielectric component, which is further inserted within a conductive, slotted via body.

FIG. 7A is an exploded view of a signal pin contact or signal center conductor 78 within the PCB construct of FIG. 5A, wherein the signal pin contact 78 is inserted within a center channel or aperture 54 of a slotted dielectric component 50, which is further inserted within a conductive, slotted via body 60. Signal center conductor 78 is assembled in channel or aperture 54 of cylindrical, slotted dielectric component 50, having slot 52 aligned with slot 62 of the cylindrical, slotted via body 60. Dielectric component 50 is inserted within and coaxial with via 60 center through-hole. PCB 58 may include a cylindrical aperture having a diameter adapted to receive the cylindrical slotted via body, or preferably, may be inserted within a conductive, cylindrical, slotted via body which is formed in-situ (layer-by-layer) during the fabrication process. The result of this embodiment of FIG. 7A is a conductive signal pin that extends through the dielectric component, above the PCB top surface at one end, and receives an electrical connection from a PCB signal trace through the slotted portions of the via body and dielectric component at another location within the PCB. For exemplary purposes, the slots are located at the lower end of the via body and dielectric component.

In this embodiment, generally a board designer would specify the dimensions of the components for impedance matching. In a preferred installation, the board designer/manufacturer would produce and assemble the embodiment of FIG. 7A, with the exception that the center signal pin 78 and slotted dielectric component 50 may be added in a later production process.

Figure 7B:
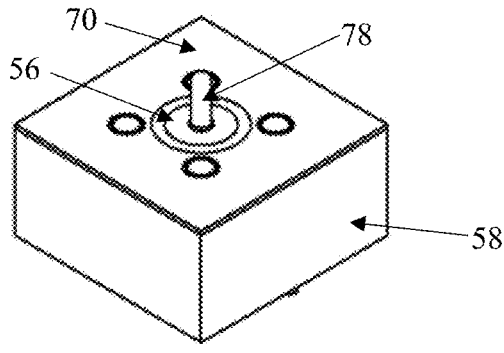
FIG. 7B depicts an isometric perspective view of the embodiment of FIG. 7A showing the center signal pin extending beyond, and perpendicular to, the PCB top surface.
Figure 7C:
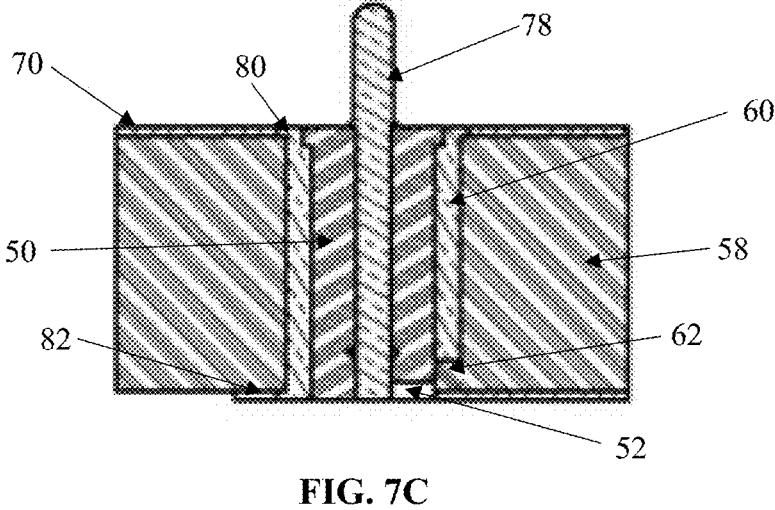
FIG. 7C depicts a side, cross-sectional view of an assembled PCB of FIG. 7A with a signal center conductor extending above the top surface of the PCB.

FIG. 7B depicts an isometric perspective view of the embodiment of FIG. 7A showing the center signal pin 78 extending beyond, and perpendicular to, the PCB top surface 70. FIG. 7C depicts a side, cross-sectional view of an assembled PCB of FIGS. 7A and 7B with a signal center conductor 78 extending above the top surface 70 of PCB 58. In FIG. 7B, a top perspective view of a preferably conductive, slotted via body 60 is shown, having a top ring 80 and bottom ring 82 coaxial with, and extending radially outwards from, a center cylindrical portion of the slotted via body 60. Furthermore, at illustrated in FIG. 7C, slot 62 interrupts the circumferential coverage of bottom ring 82. Slotted via body 60, when conductive (which may be formed from a non-conductive component plated with a conductive material), provides for a ground connection. (It should also be noted that slotted via body 60 may be formed of a solid conductive material, or may be fabricated layer-by-layer in the PCB manufacturing process.) As discussed further herein, in order to allow a signal line to traverse slotted via body 60 without shorting, a slotted dielectric component 50 is employed, where the slot 52 of the dielectric component aligns with the slot 62 of the slotted via body 60.

Thus, even though conductive, slotted via body 60 encompasses dielectric component 50, and dielectric component 50 shields signal center conductor 78 from shorting against the conductive slotted via body 60, the slotted portions allow for a signal trace to be in electrical communication with the signal center conductor 78 without shorting to the slotted via body. As shown, slot 62 of slotted via body 60 is aligned with dielectric component slot 52 of dielectric component 50.

In the illustrative embodiment, slotted dielectric component 50 includes a cylindrical disc or ring 56 at its top end having an outer diameter greater than the outer wall of the cylindrical body of slotted dielectric component 50. The outer diameter of cylindrical disc or ring 56 is also less than the inner diameter of the hole opening 64 of slotted via body 60, but greater than an inner diameter of an inner wall 68 of slotted via body 60, such that in at least one embodiment, cylindrical disc or ring 56 is seated within an annular receiving portion at one end of the slotted via body 60, and is approximately planar with the top surface 70 of PCB 58.

Figure 8A:
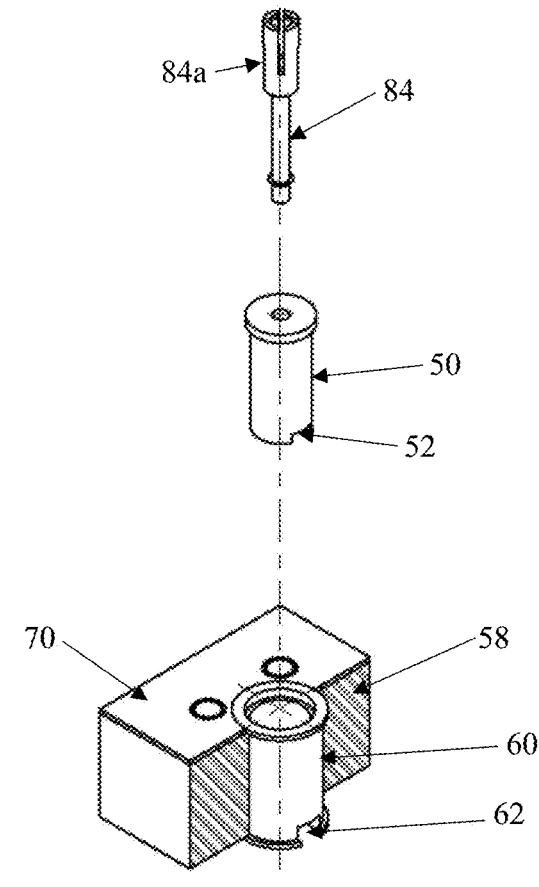
FIG. 8A depicts an exploded view of a socket contact with a slotted via body and slotted dielectric design, where the socket contact extends perpendicularly from the top surface of the PCB.

FIG. 8A depicts an exploded, top perspective view of a socket contact extension 84 having socket 84a within a slotted dielectric component 50, and slotted via body 60, where the socket contact extension 84 and socket 84a extend perpendicularly from the top surface 70 of the PCB 58. That is, the socket 84a is outside the PCB and receives a signal pin of a complementary mating PCB connector for electrical contact outside the PCB.

Slotted via body 60 encompasses a slotted dielectric component 50, which includes a center conductor, socket contact extension 84 with socket 84a that extends longitudinally upwards and connects with a signal conductor on a PCB connector (not shown) outside the PCB. In this embodiment, the extended socket 84a outside the PCB connects with a center conductor of a PCB connector, such as PCB connector 170 of FIG. 24, to receive the center conductor pin 172. Socket 84a is designed to receive a complementary pin from a male connector; the electrical connection taking place above the top surface 70 of PCB 58.

Figure 8B:
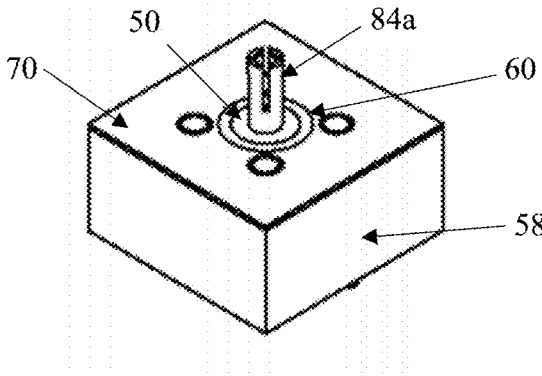
FIG. 8B depicts an assembled, perspective view of FIG. 8A with the slotted via body and slotted dielectric component inserted within the PCB.

FIG. 8B depicts a top perspective view of the assembly of FIG. 8A with the slotted dielectric component 50 inserted within slotted via body 60 into PCB 58. Socket 84a extends above the top surface 70 of PCB 58.

Figure 8C:
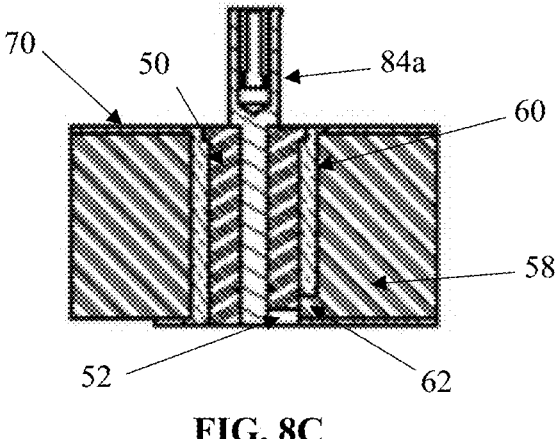
FIG. 8C is a partial cross-sectional view of the assembly of FIG. 8B depicting the alignment of the slots of the slotted dielectric component and the slotted via body.

FIG. 8C is a partial cross-sectional view of the assembly of FIG. 8B depicting the alignment of the slots of the slotted dielectric component and the slotted via body.

Figure 9A:
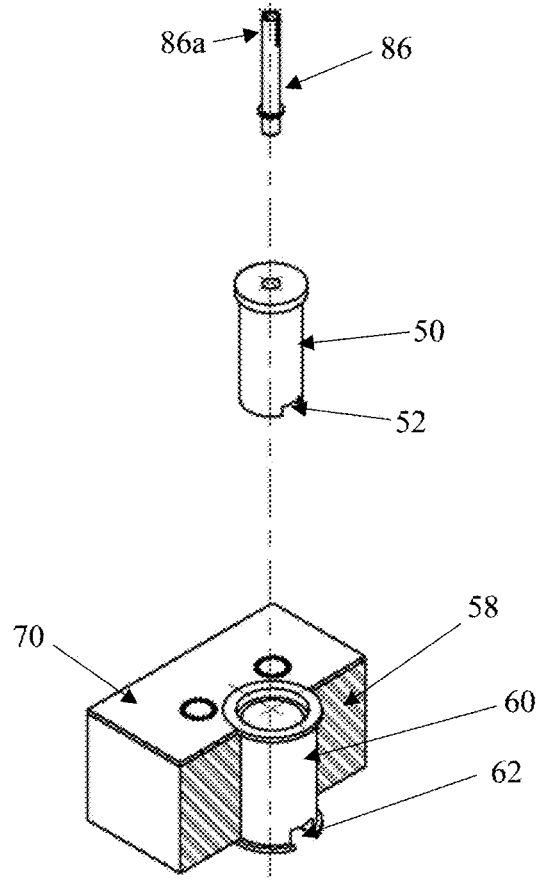
FIG. 9A depicts an exploded, top perspective view of an internal socket contact and receiving socket within a slotted via body and slotted dielectric design, where the socket is flush with the top surface of the PCB.

FIG. 9A depicts an exploded, top perspective view of an internal socket contact extension 86 having a receiving socket 86a top portion, that is insertable within a slotted via body 60 and slotted dielectric 50 design, where the socket 86a is approximately flush with the top surface 70 of the PCB 58. That is, upon insertion, the socket 86a is internal to the PCB and receives a signal pin of a complementary mating connector for electrical contact within the PCB, such as the PCB connector 192 shown in FIG. 28.

Figure 9B:
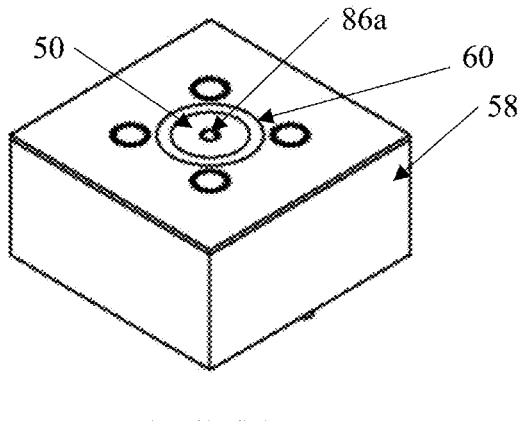
FIG. 9B depicts an assembled, perspective view of FIG. 9A with the internal socket approximately flush with the top surface of PCB.

FIG. 9B depicts a perspective view of the assembly of FIG. 9A with the internal socket 86a approximately flush with the top surface 70 of PCB 58.

Figure 9C:
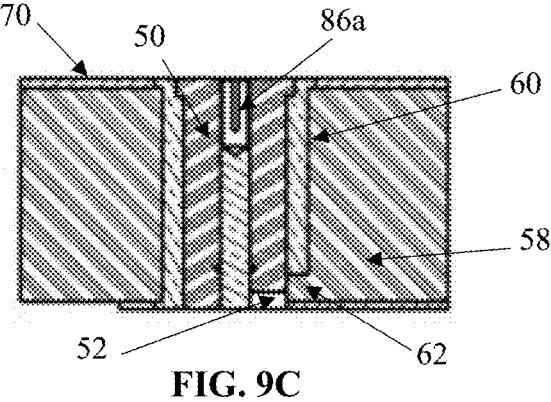
FIG. 9C is a partial cross-sectional view of the assembly of FIG. 9B, depicting the socket and pin located coaxial with the conductive, slotted via body and slotted dielectric component.

FIG. 9C is a partial cross-sectional view of the assembly of FIG. 9B, depicting the socket 86a located coaxial with the slotted via body 60 and slotted dielectric component 50. This assembly provides a pin socket to receive an extended center signal pin (see pin 194 of FIG. 28) of a mating PCB connector (such as PCB connector 192 of FIG. 28). Socket 86a provides an internal female signal contact to receive an extended center signal pin 194 of a PCB connector 192. Female signal contact 86 extends the electrical signal of the socket extension to a solder bridge or PCB trace through the slots of the slotted dielectric component and slotted via body.

Figure 10A:
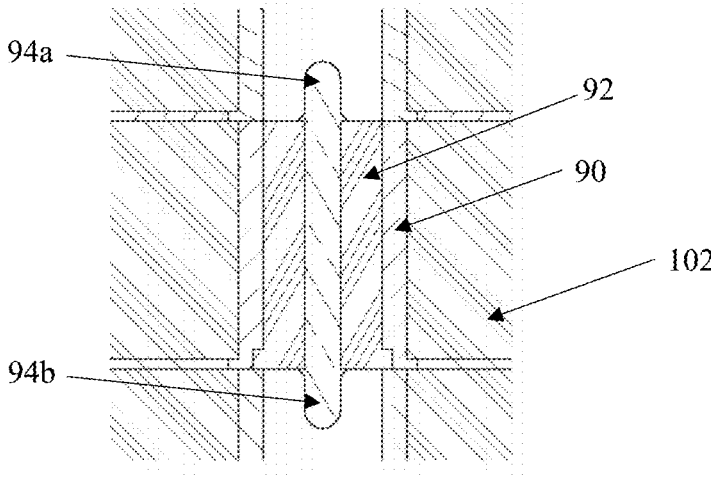
FIG. 10A illustrates a middle interconnecting section of a multilayer PCB with a conductive buried via (FIG. 11, section B), which may include a conductive, slotted via body, and a corresponding slotted dielectric component with an extended pin protruding from the top and bottom of the internal via.
Figure 10B:
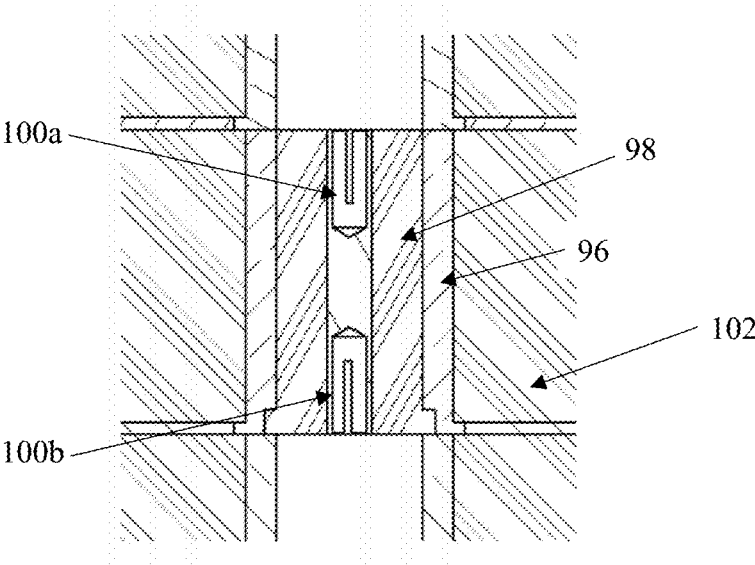
FIG. 10B depicts another concept of an interconnecting middle section (FIG. 11, section B) of a double socket, buried via design connecting to the top and bottom via layers which may have a slotted via body and slotted dielectric of the embodiments of the present invention.
Figure 10C:
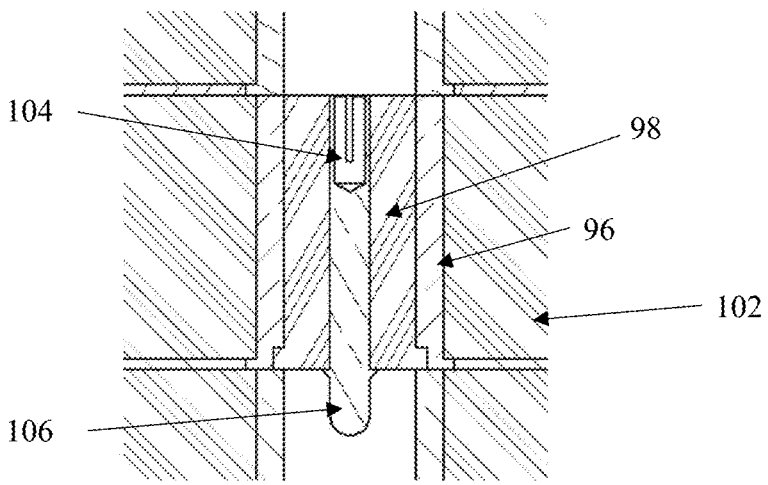
FIG. 10C depicts yet another alternate interconnecting middle section (FIG. 11, section B) of a buried via design having a socket for receiving a pin at one end, and at the other end an extended pin for mating with a complimentary socket, where the via body and dielectric component may be slotted.

FIGS. 10A-10C depict different internal layer interconnections buried via designs connecting to the slotted via body and slotted dielectric of the embodiments of the present invention in a PCB. FIG. 10A illustrates a buried plated via 90 having a corresponding dielectric component 92 with extended pins 94a,b protruding from the top and bottom of the internal, buried via within PCB 102. In this embodiment, it is possible for the slotted portions of the via external body and dielectric component to be located in both the top and bottom via layers of the buried via design, or a single set of slots at either the top or bottom can be effectively utilized in a design.

In an alternate embodiment, an extended portion of a signal line may extend underneath the via until it reaches a center channel where electrical contact can be made to a conductive member inserted within channel. In yet another embodiment, instead of adding an insulator, the outer wall of the via body may be shortened near the signal line, such that an air gap is formed between the via body and the signal line.

FIG. 10B depicts a buried, double socket design utilizing the slotted via body 96 and slotted dielectric component 98 of the embodiments of the present invention. Dual sockets 100a,b are located at each end of the buried via within PCB 102. Similar to the embodiment of FIG. 10A, it is possible for the slotted portions of the via and dielectric component to be located on both the top and bottom portions of the buried via connector design, although a single set of slots at either the top or bottom can be effectively utilized in a design.

FIG. 10C depicts an alternate via design having at one end a socket 104 for receiving a connector pin, and at the other end an extended pin 106 for mating with a female connector portion. Similar to the embodiments of FIGS. 10A and 10B it is possible for the slotted portions of the via body and dielectric component to be located on both the top and bottom portions of the buried via connector design. This via may be constructed as a blind via or buried via configuration.

Design Implementations for Different Types of Slotted Vias

Figure 11:
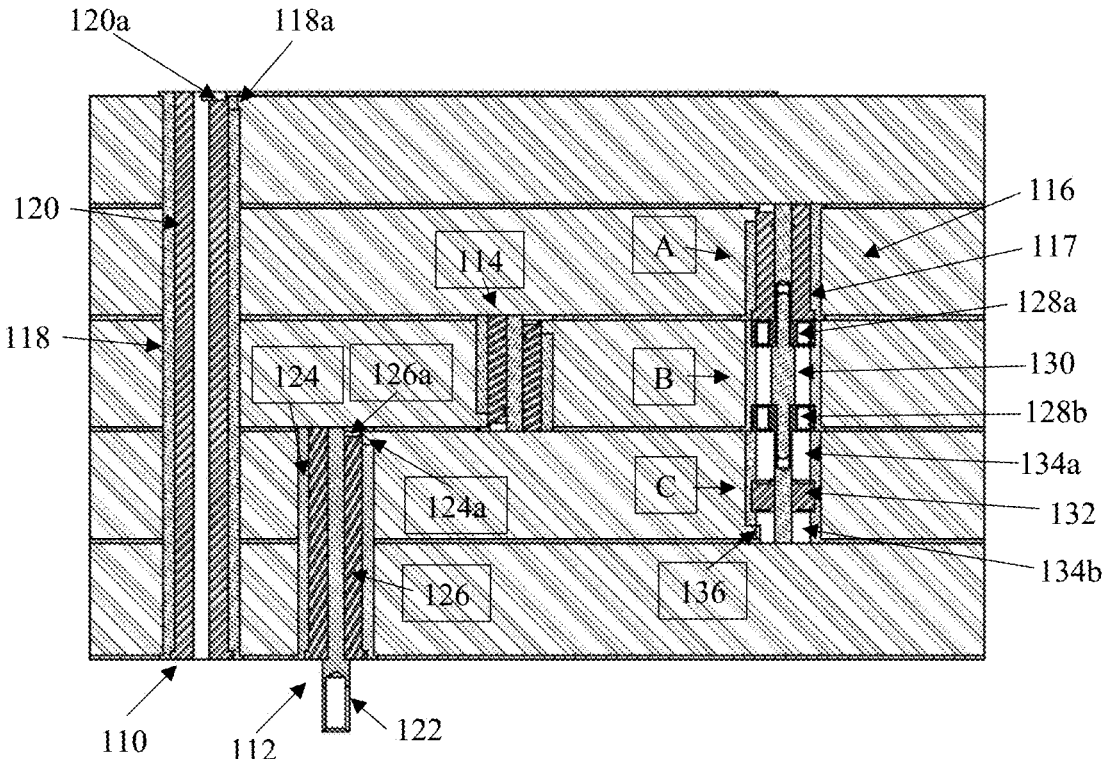
FIG. 11 illustrates different PCB via types that can employ the slotted via body/slotted dielectric component combination of the present invention.

FIG. 11 illustrates different PCB via types that can employ the slotted via body/slotted dielectric component combination of the present invention. Depicted is a through-hole via 110, a blind via 112, a buried via 114, a staggered via combination (e.g., blind and buried vias shown staggered), and a stacked via 116 having multi-connectors (pin/socket), and multi-dielectric component designs.

A blind via 112 connects an outer layer of the board to inner layers and does not go through the entire board. A buried via 114 connects inner layers without reaching the outer layers. And a through hole via 110 goes all the way through, from top to bottom, touching all adjacent layers. Staggered vias (e.g., combination of via 112 and 114) are the most common and economical form of microvias. However, staggered microvias require more space as a result of not being built around the same core.

Stacked vias are used if, for example, an essential blind via exceeds an aspect ratio of 1:1 phasing out sequential lamination due to a new blind via starting on the same layer that the aforementioned blind via ends. A stacked via consists of multiple vias layered directly on top of each other. Typically, each via is first drilled and then metalized, leaving a small annular ring at the top and bottom to ensure electrical connection. Because one via can be placed on top of another, stacked vias take up less space on a PCB than through-hole via. This makes successful routing of high-density boards more practical and flexible. Good use of stacked vias allows full flexibility in layer connectivity. It also reduces the parasitic capacitance typically associated with vias.

Many PCB boards are small and have a limited amount of space, so the blind and buried vias can provide additional room and options for the board. The buried vias, for example, will help to free up space on the surface of the board without affecting the surface components or traces that are on the top or bottom layers. The blind vias can help to free up some additional space. They are often used for fine pitch BGA components. Since the blind vias only go through a portion of the board, it also means that there will be a reduction of signal stubs.

Blind vias are common in high-density interconnect (HDI) PCBs. The added complexity of blind vias allows designers to improve signal integrity while reducing PCB size. Using blind vias presents a range of new routing alternatives and options as valuable space is no longer needed for through-hole vias, which travel through layers where they are not connected to.

While the blind and buried vias can be used with many various PCBs, they tend to be used most often for high-density interconnect PCBs.

Referring to FIG. 11, through-hole via 110 exemplifies the via depicted in FIG. 5C, presenting a conductive, slotted via body 118 with slot 118$a$, and slotted internal dielectric 120 with slot 120$a$. Blind via 112 is shown with an extended socket 122 at one end, and slotted portions 124$a$, 126$a$ of the conductive, slotted via body 124 and dielectric component 126 (respectively) at the other end. Extended socket 122 is shown for exemplary purposes only, and other connections may be utilized, such as an internal socket or extending connector pin. A blind via may only penetrate to a certain predetermined number of layers such that the via does not extend through the board. This type of via may be filled with material or the layers of the PCB. A ground layer may be embedded within the PCB, and in electrical connection with a conductive, slotted via body of an embodiment of the present invention. Generally, a signal layer connects through the slotted apertures to the center conductor within, and coaxial with, the dielectric component, which is designed to receive a complementary connection from a PCB connector.

Buried via 114 depicts slotted portions that may be designed on the top and/or bottom ends of the via. Shown is a construction of a buried via incorporating the salient features of at least one embodiment of the present invention. Buried via 114 is situated at a certain depth within the PCB, generally a predetermined number of layers within the PCB, such that the buried via does not extend through the board on either side. This type of via may include an air layer, PCB material, or other dielectric material with respect to its placement in the PCB. A signal layer or trace is embedded within the PCB, and in electrical communication with an electrical conductor within the slotted dielectric component. The signal layer or trace connects through the slotted apertures of the via body and dielectric component to a center contact pin (not shown).

Figure 12:
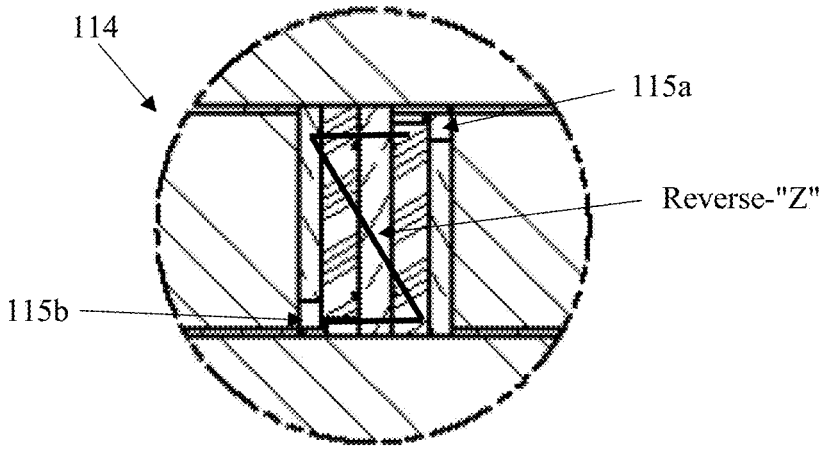
FIG. 12 depicts an enlarged cross-sectional view of a buried via with a slot at the top end on one side, and a slot located at the bottom end diametrically opposed to the top end slot, in a reverse-"Z" configuration.

FIG. 12 depicts an enlarged cross-sectional view of buried via 114 with slot 115$a$ at the top end on one side, and slot 115$b$ located at the bottom end diametrically opposed to slot 115$a$. For the two-slot opening designs, the slots may be in the same direction in a "C" pattern (not shown), where each slot is formed at the end of a "C", or a mirrored or reverse-"C", or alternatively, in a "Z" pattern, that is, at the top and bottom end of a "Z" or a mirrored or reverse-"Z" (as shown in FIG. 12). A reverse-"Z" is depicted on FIG. 12 to illustrate the placement of the opposing slots.

Stacked via 116 is shown cutting through three PCB layers, and presents three different dielectric component embodiments of the present invention. In the topmost via of the stacked combination (A), the conductive, slotted via body and slotted dielectric component 117 design are common to those presented in FIG. 5C, and may be designed with dielectric D$_1$. However, in the middle via (B) of the stack, dielectric component is shown as two separate cylindrical rings 128$a$,$b$ having a dielectric constant D$_2$ which may be different than D$_1$ with a (dielectric) air-gap 130 therebetween, which would also have a dielectric constant, D$_3$, different from D$_1$ and D$_2$. In this embodiment, the dielectric component 128$a$,$b$ is not a full cylinder from top to bottom of the internal via. Lower via (C) includes a single dielectric component cylindrical ring 132 with air gaps 134$a$,$b$ above and below. The single dielectric component may be of a dielectric constant D$_4$ different from D$_1$ or D$_2$ or D$_3$. A slotted portion 136 of the via body is shown extending to the lower air gap 134$b$.

PCB Connector Schemes

Different connector schemes may be employed to accommodate the above-identified slotted via body and slotted dielectric component designs. In some embodiments, an external dielectric PkZ® connector may be utilized having a slotted dielectric component attached thereto. A PkZ® connector, such as that designed and manufactured by the Phoenix Company of Chicago, accommodates large radial and axial misalignment tolerances found in modular applications. PkZ® technology does not require full mating to achieve constant impedance, eliminating elaborate methods such as an internal spring to overcome mating gaps and guarantee full mating.

Impedance changes in a typical coaxial connector interface as a gap is introduced due to typical and expected changes in the ratio of conductors and the dielectric constant. PkZ® designs provide constant impedance even as differences in mating profiles or gaps are created in the mating interface.

The inner and outer contacts of a male connector plug and a female connector plug are of predetermined shape, and the material for the dielectric is chosen, such that when the male connector plug is engaged with the female connector plug, along the central axis of the engaged connection, the effective outer diameter of the inner contact referenced by "d", the effective inner diameter of the outer contact referenced by "D", and the relative dielectric constant of the medium therebetween referenced by £, satisfy the above-identified equation for impedance "Z". The geometry is determined and the dielectric material selected so that anywhere along the central axis of the connector the impedance is substantially constant. In this manner, a constant impedance connector allows for tolerances in the connector housings that may otherwise degrade electrical performance of the connectors.

Figure 13A:
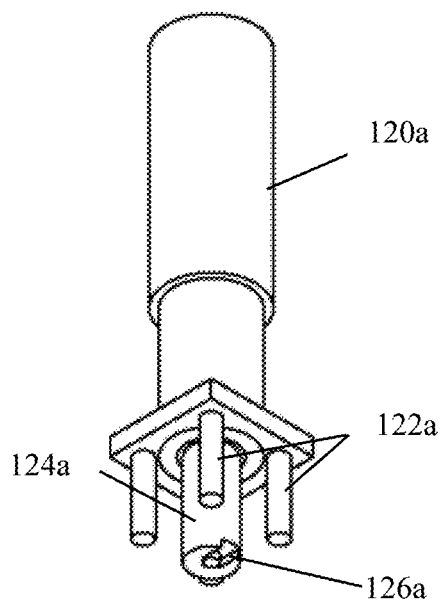
FIG. 13A depicts a bottom perspective view of a PCB connector having longitudinally extending prongs, which may be ground prongs, and a center signal conductor having a slotted, dielectric cylindrical sleeve attached thereto with a slot exposed on the bottom surface thereof.

FIG. 13A depicts a bottom perspective view of a PCB connector 120$a$ having longitudinally extending prongs 122$a$, which may be employed for mechanical integrity and possibly for grounding, and a center signal conductor extending through a slotted, dielectric component cylindrical sleeve 124$a$ attached thereto with slot 126$a$ exposed on the bottom surface thereof. The embodiment of FIG. 13A is designed for insertion within a PCB having a complementary receiving slotted via body as depicted in FIG. 14. PCB connector 120$a$ of FIG. 13A may be a PkZ® connector for the purposes of establishing a constant impedance upon connection.

Figure 13B:
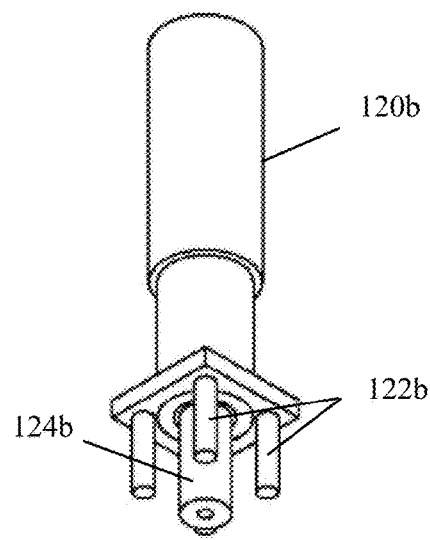
FIG. 13B depicts a bottom perspective view of a PCB connector having longitudinally extending prongs for mechanical and/or grounding capabilities, and a center conductor extending through a non-slotted dielectric component cylindrical sleeve.

FIG. 13B depicts a bottom perspective view of a PCB connector 120$b$ having longitudinally extending prongs 122$b$ for mechanical and/or grounding capabilities, and a center conductor extending through a non-slotted dielectric component cylindrical sleeve 124$b$. The embodiment of FIG. 13B is designed for insertion within a PCB having a complementary receiving unslotted via body (not shown). PCB connector 120b of FIG. 13B may be a PkZ® connector for the purposes of establishing a constant impedance upon connection.

Figure 13C:
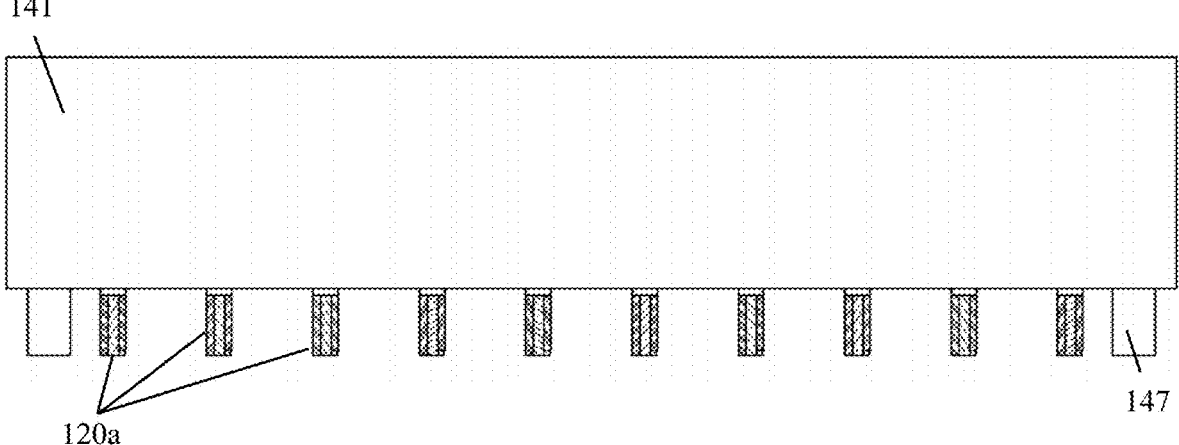
FIG. 13C depicts a connector assembly having a plurality of PCB connectors with slotted dielectric components, and extended prongs for mechanical integrity and grounding.
Figure 13D:
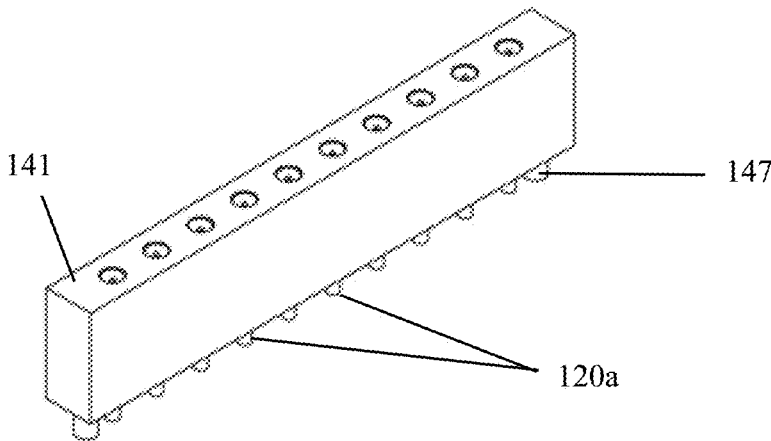
FIG. 13D depicts a top perspective view of the connector assembly of FIG. 13C.

FIG. 13C depicts a connector assembly 141 having a plurality of PCB connectors 120a with slotted dielectric components, and extended prongs 147 for mechanical integrity and grounding. The connector assembly may also incorporate a plurality of unslotted dielectric components 120b, such as those of FIG. 13B. Furthermore, a combination of the two PCB connector types 120a, 120b may also be simultaneously employed. Moreover, some or all of the connectors may be PkZ® type connectors. The embodiment of FIG. 13C illustrates a rectangular shaped connector assembly, as depicted by the top perspective view of FIG. 13D. The rectangular shaped connector assembly is shown for exemplary purposes. Other connector assembly shapes may be employed and are not prohibited by the present design. For example, a connector assembly having a square footprint (attachment surface to the PCB) or a circular footprint may be employed utilizing a plurality of PCB connectors, which may include slotted or unslotted via components, or a combination of both. In exemplary embodiments, the footprint of the connectors themselves, or of the assembly structure may be in the form of a square array, rectangular array, circular array, or polygon array.

Figure 14A:
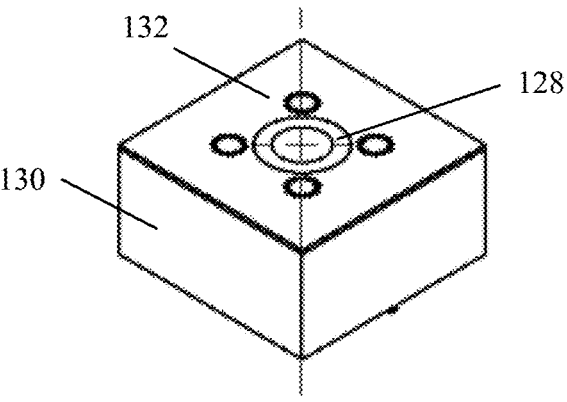
FIG. 14A is a top perspective view of a conductive, slotted via body inserted within a channel of a PCB, which is constructed to receive the PCB connector of FIG. 13A, such that the slot in the conductive, slotted via body is aligned with slot on dielectric cylindrical sleeve of the connector of FIG. 13A.

FIG. 14A is a top perspective view of a conductive, slotted via body 128 inserted within a channel of PCB 130, which is constructed to receive the PCB connector 120a with the slotted, dielectric component cylindrical sleeve 124a attached thereto, such that the slot (not shown) in via body 128 is aligned with slot 126a on dielectric component cylindrical sleeve 124a, and the dielectric component cylindrical sleeve 124a seats within, and is coaxial with, slotted via body 128 such that the top surface of dielectric cylindrical sleeve 124a is approximately flush with the top surface 132 of PCB 130.

Figure 14B:
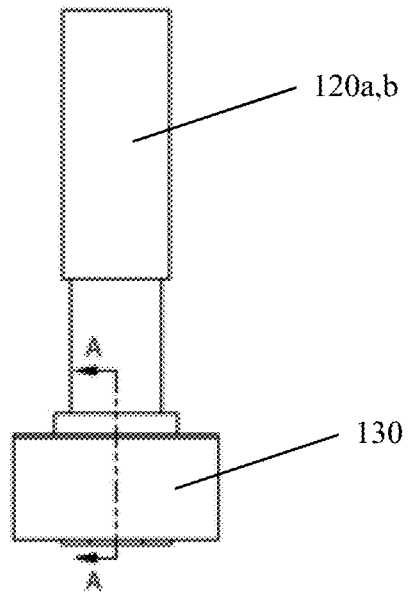
FIG. 14B depicts a side-view of the PCB connector of FIGS. 13A and 13B attached to the PCB.
Figure 15:
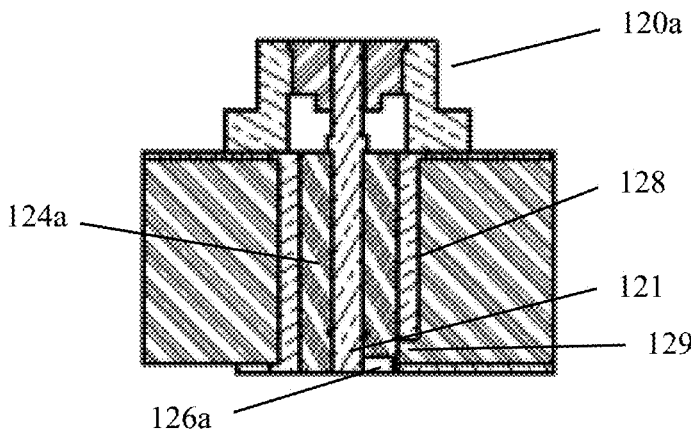
FIG. 15 is a partial cross-sectional view of the attachment scheme of FIG. 14B as shown at section A-A.

FIG. 14B depicts a side-view of the PCB connector 120a,b attached to PCB 130. FIG. 15 is a partial, cross-sectional view of the attachment shown in FIG. 14B as shown at section A-A (ground prongs 122a,b are not shown for clarity). PCB connector 120a includes a pin contact 121 inserted within dielectric component cylindrical sleeve 124a, and extending the approximate length of the sleeve 124a to the aligned slots of the dielectric cylindrical sleeve (slot 126a) and the slotted via body 128 having slot 129.

Figure 16A:
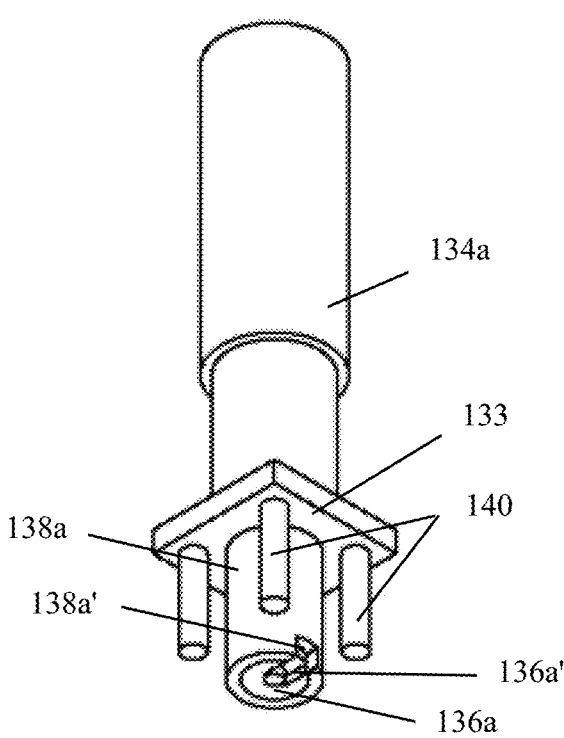
FIG. 16A depicts an extended connector (which may also be a PkZ® connector) having a body configuration with both the slotted dielectric component and slotted via body attached thereto.

FIG. 16A depicts an extended connector 134a (which may also be a PkZ® connector) having a body configuration with both a slotted dielectric component 136a and a slotted via body 138a attached thereto. Both the dielectric component and slotted via body extend from the bottom planar surface 133 of the PCB connector. Slot 136a' of dielectric component 136a is shown aligned with slot 138a' of slotted via body 138a. Ground posts and/or attachment posts 140 extend parallel to the longitudinal or axial axis of the dielectric component and slotted via body. In this embodiment, both the slotted dielectric component and aligned, slotted via body are supported on the connector.

Figure 16B:
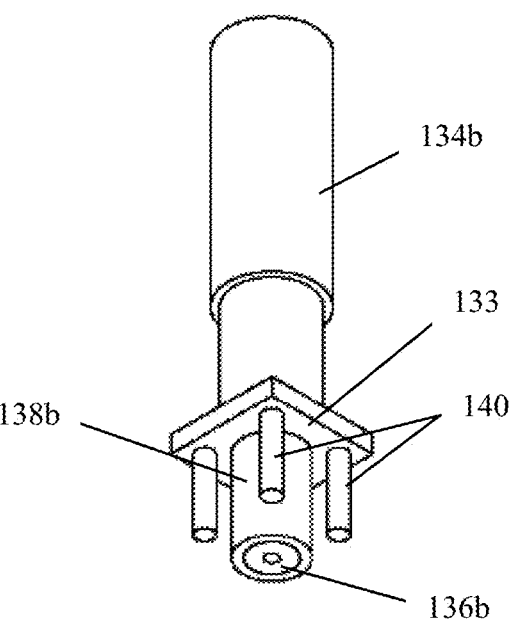
FIG. 16B depicts an extended connector (which may also be a PkZ® connector) having a body configuration with both an unslotted dielectric component and an unslotted body attached thereto, where both the dielectric component and via body extend from the bottom planar surface of the PCB connector.

FIG. 16B depicts an extended connector 134b (which may also be a PkZ® connector) having a body configuration with both a unslotted dielectric component 136b and an unslotted via body 138b attached thereto. Both the dielectric component and via body extend from the bottom planar surface 133 of the PCB connector. Ground posts and/or attachment posts 140 extend parallel to the longitudinal or axial axis of the dielectric component and slotted via body. In this embodiment, both the dielectric component and conductive via body are supported on the connector.

Figure 16C:
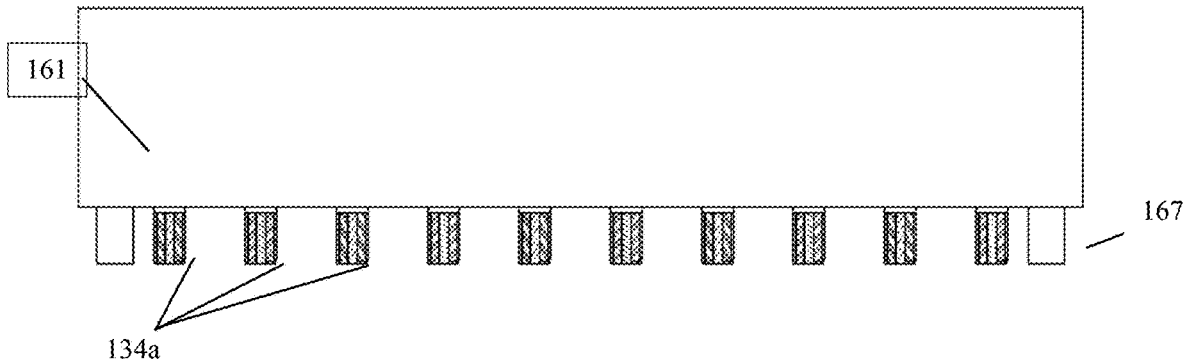
FIG. 16C depicts a connector assembly having a plurality of PkZ® PCB connectors, each with a slotted body and slotted dielectric component, and extended prongs for mechanical integrity and grounding.
Figure 16D:
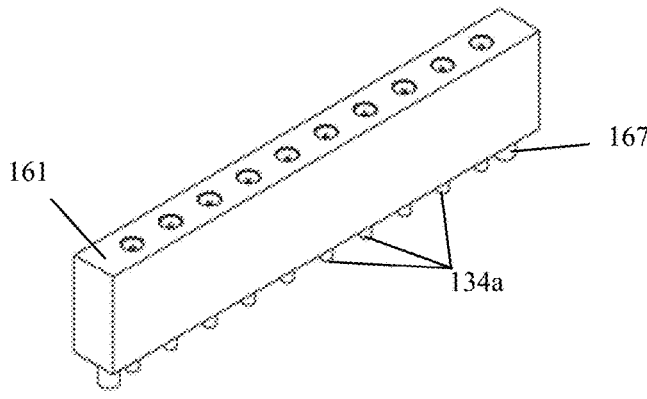
FIG. 16D depicts a top perspective view of the connector assembly of FIG. 16C.

FIG. 16C depicts a connector assembly 161 having a plurality of PCB connectors 134a, which may include some PkZ® type connectors. Each of the plurality of connectors may include a slotted via body and slotted dielectric component, and extended prongs 167 for mechanical integrity and grounding. The connector assembly may also incorporate a plurality of unslotted via body and unslotted dielectric components 134b, such as those of FIG. 16B. A combination of the two PCB connector types 134a, 134b may also be simultaneously employed. The embodiment of FIG. 16C illustrates a rectangular shaped connector assembly, as depicted by the top perspective view of FIG. 16D. The rectangular shaped connector assembly is shown for exemplary purposes. Other connector assembly shapes may be employed and are not prohibited by the present design. For example, a connector assembly having a square footprint (attachment surface to the PCB) or a circular footprint may be employed utilizing a plurality of PCB connectors, which may include slotted or unslotted via components, or a combination of both. In exemplary embodiments, the footprint of the connectors themselves, or of the assembly structure may be in the form of a square array, rectangular array, circular array, or polygon array.

Figure 17:
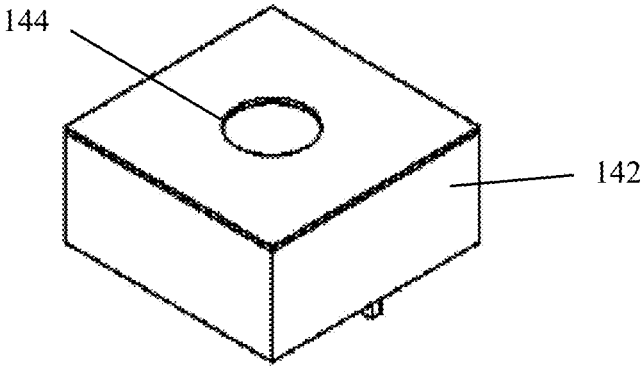
FIG. 17 is a top perspective view of the receiving PCB for the connector of FIG. 16A, having a through-hole for receiving the slotted via body of the connector of FIG. 16A.

Conductive, slotted via body 138a and cylindrically inserted dielectric component 136a are attached to the PCB 142 of FIG. 17. FIG. 17 is a top perspective view of the receiving PCB for the connector of FIG. 16A, having a through-hole for receiving the slotted via body of the connector of FIG. 16A. Conductive, slotted via body 138a is attached coaxially with dielectric component 136a, such that their respective radially extending slots 138a', 136a' align to form a gap from the center signal line of the PCB connector to a signal line (not shown) on PCB 142. PCB 142 has a via through-hole 144 which can be either plated or un-plated depending upon the grounding scheme for a given configuration.

Figure 18:
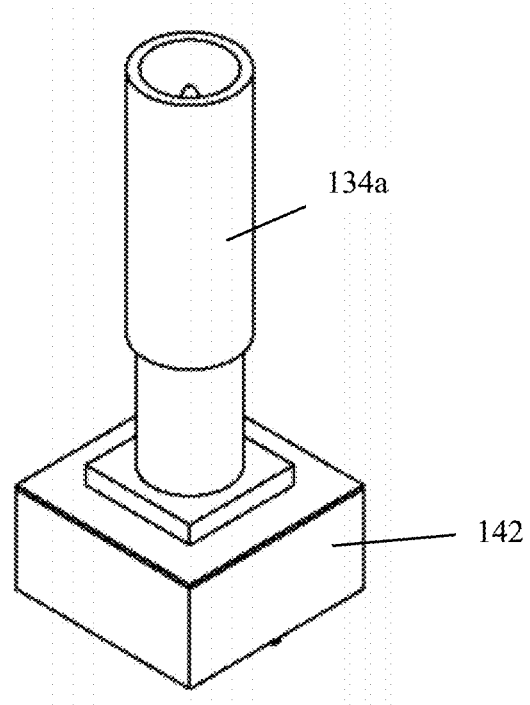
FIG. 18 is a top perspective view of the PCB connector of FIG. 16A attached to the PCB of FIG. 17.

FIG. 18 is a top perspective view of the PCB connector 134a of FIG. 16A attached to the PCB 142 of FIG. 17.

Figure 19:
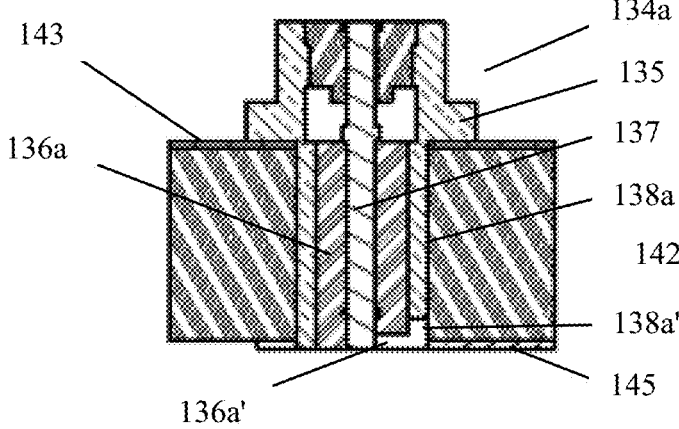
FIG. 19 is a partial cross-sectional view of the attachment shown in FIG. 18.

FIG. 19 is a partial cross-sectional view of the attachment shown in FIG. 18. An outer cylindrical footing 135 of PCB connector 134a mates with the top side 143 of PCB 142. Pin contact 137 is shown extending through the via 138a and dielectric component 136a. In a similar fashion to the previous embodiments, the embodiment of FIG. 19 utilizes a slotted via body 138a coaxial with a slotted dielectric component 136a, with a gap produced by the aligned slots 136a', 138a' such that a solder bridge or other conductive trace line 145 can make electrical connection with the signal center conductor 137.

Figure 20:
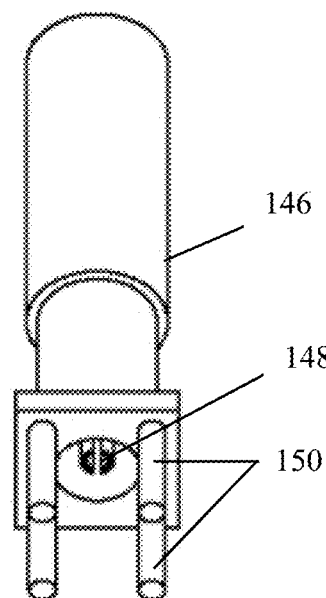
FIG. 20 depicts yet another embodiment of the present invention in which a PCB connector is utilized having a rear in-socket center contact on the signal line for receiving a pin extending from a through-hole via within the PCB.

FIG. 20 depicts yet another embodiment of the present invention in which a PCB connector is utilized having a rear in-socket center contact on the signal line for receiving a pin extending from a through-hole via inserted within the PCB. PCB connector 146 includes a center signal pin that terminates in a socket contact 148. In this illustrative embodiment, longitudinally extending mechanical structural prongs 150, which may be ground prongs, locate the PCB connector 146 to PCB 152.

Figure 21:
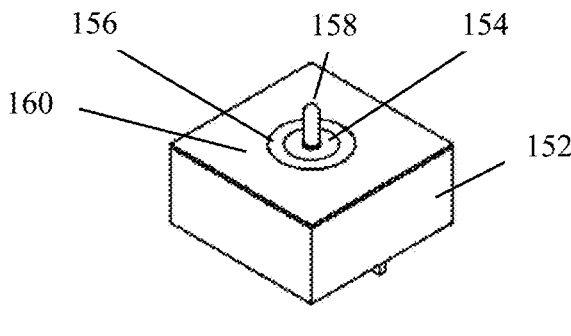
FIG. 21 depicts a PCB having an extended pin contact within a slotted dielectric component, surrounded by a slotted via body, which is designed to receive the connector of FIG. 20.

FIG. 21 depicts PCB 152 designed to receive an in-socket connector 146 of FIG. 20. On the PCB 152, a slotted, dielectric component 154 is assembled within a slotted, and preferably conductive via body 156. Slotted, dielectric component 154 has a center signal conductor 158 assembled therein and extending above the top surface 160 of PCB 152.

In this manner, center signal conductor 158 is insertable within socket contact 148 when PCB connector 146 is assembled on PCB 152.

Figure 22:
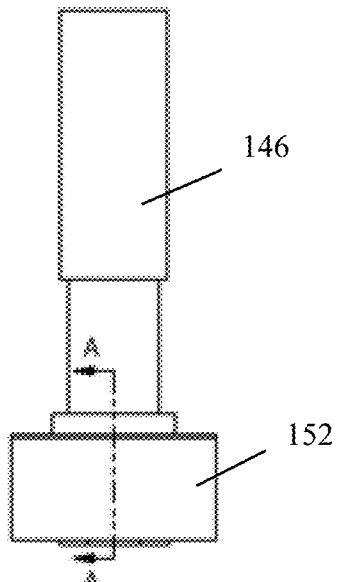
FIG. 22 depicts a side-view of the PCB connector of FIG. 20 attached to the PCB.
Figure 23:
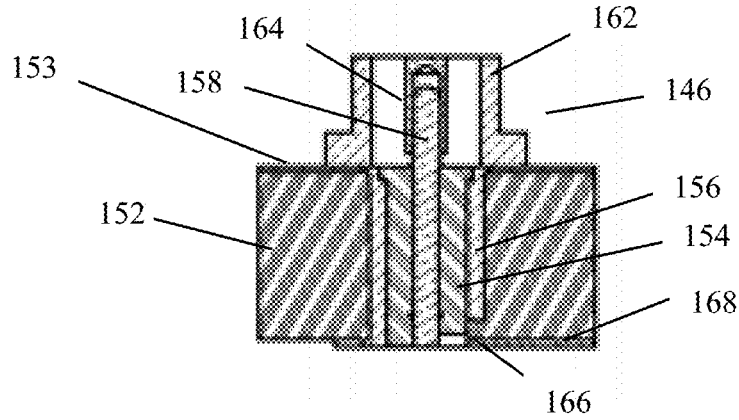
FIG. 23 is a partial cross-sectional view of the attachment scheme of FIG. 22 as shown at section A-A.

FIG. 22 depicts a side-view of the PCB connector 146 attached to PCB 152. FIG. 23 is a partial cross-sectional view of the attachment shown in FIG. 22 as shown at section A-A (ground prongs 136 are not shown for clarity). An outer cylindrical footing 162 of PCB connector 146 mates with the top side 153 of PCB 152. Socket contact 164 is shown attached to signal center conductor 158 extending from the via 156. In a similar fashion to the previous embodiments, the embodiment of FIG. 22 utilizes a conductive, slotted via body 156 coaxial with a slotted dielectric component 154, with a gap 166 produced by the aligned slots such that a solder bridge or other conductive trace line 168 can make electrical connection with the signal center conductor 158.

Figure 24:
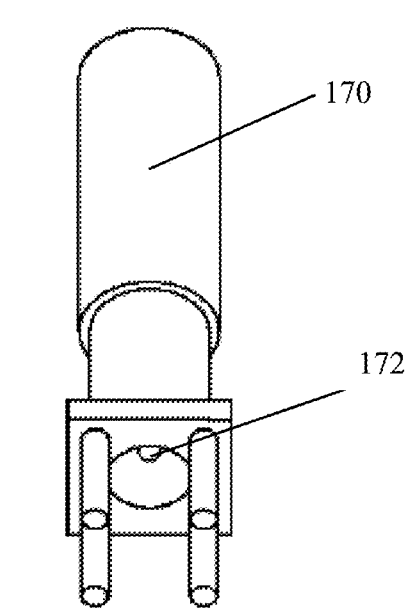
FIG. 24 depicts a perspective view of a connector, such as but not limited to, a PkZ® connector, having an internal pin contact for insertion with an external complementary socket connector extending from the PCB top surface.

FIG. 24 depicts a bottom perspective view of connector 170, such as but not limited to, a PkZ® connector, having an internal pin contact 172 for insertion with an external complementary socket connector extending from the PCB top surface.

Figure 25:
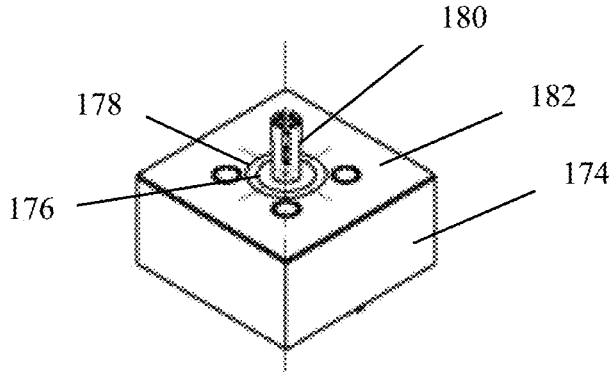
FIG. 25 depicts a PCB having an extended socket designed to receive the internal pin contact connector of FIG. 24, wherein the extended socket is situated within a slotted dielectric component inserted within a slotted via body.

FIG. 25 depicts PCB 174 designed to receive the internal pin contact connector 170 of FIG. 24. On the PCB 174, a slotted, dielectric component 176 is assembled within a slotted, and preferably conductive via body 178. Slotted, dielectric component 176 has an extended socket 180 extending above the top surface 182 of PCB 174. In this manner, center signal conductor 172 is insertable within socket contact 180 when PCB connector 170 is assembled on PCB 174.

Figure 26:
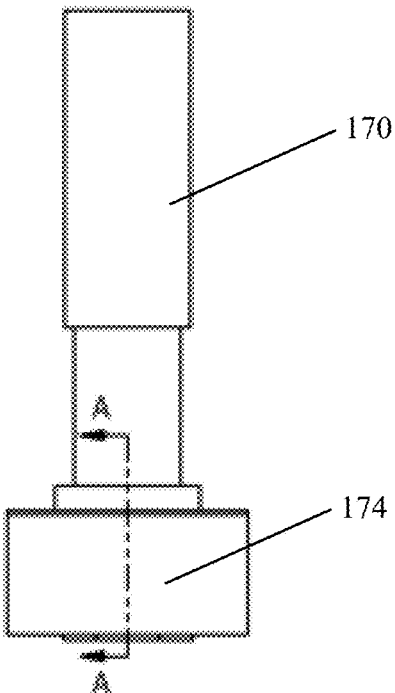
FIG. 26 depicts a side-view of a PCB connector of FIG. 24 attached to the PCB of FIG. 25.
Figure 27:
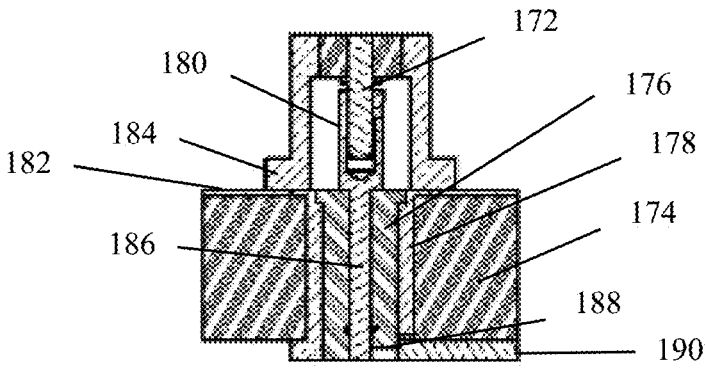
FIG. 27 is a partial cross-sectional view of the attachment shown in FIG. 26 as shown at section A-A (ground prongs are not shown for clarity)

FIG. 26 depicts a side-view of the PCB connector 170 attached to PCB 174. FIG. 27 is a partial cross-sectional view of the attachment shown in FIG. 26 as shown at section A-A (ground prongs are not shown for clarity). An outer cylindrical footing 184 of PCB connector 170 mates with the top side 182 of PCB 174. Socket contact 180 is shown attached to signal center conductor 186 extending through the via 178. In a similar fashion to the previous embodiments, the embodiment of FIG. 27 utilizes a conductive via body 178 coaxial with a slotted dielectric component 176, with a gap 188 produced by the aligned slots such that a solder bridge or other conductive trace line 190 can make electrical connection with the signal center conductor 186.

Figure 28:
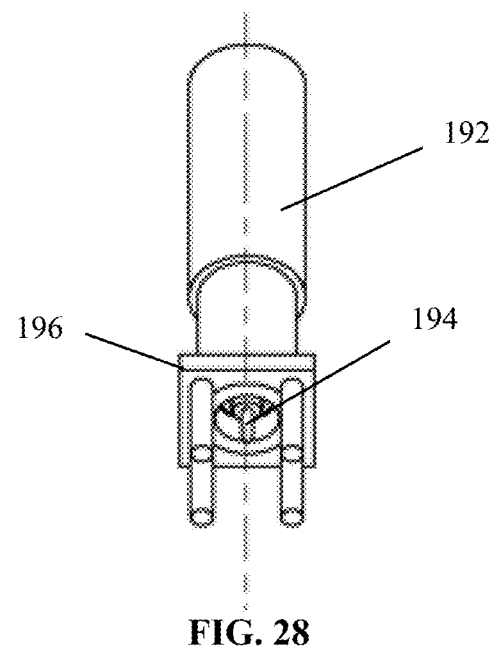
FIG. 28 is a bottom perspective view of another attachment scheme of the present invention depicting a PCB connector having an extended pin contact.

FIG. 28 is a bottom perspective view of another attachment scheme of the present invention depicting a PCB connector 192 having an extended pin contact 194. The extension of pin contact 194 is below the surface contact plate 196 of connector 192. In this manner, pin contact 194 can be inserted into a receiving, complementary socket within a PCB.

Figure 29:
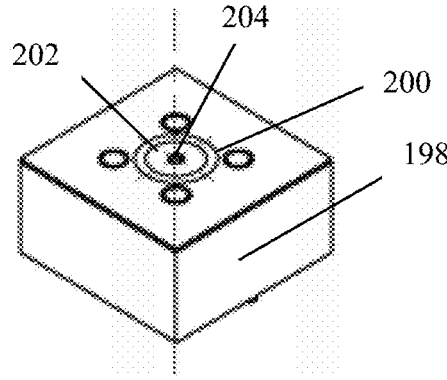
FIG. 29 depicts a top perspective view of a PCB, which includes a conductive, slotted via body with a dielectric component inserted therein for receiving the PCB connector of FIG. 28.

FIG. 29 depicts a top perspective view of PCB 198, which includes a slotted conductive via body 200 with a slotted dielectric component 202 inserted therein for receiving the PCB connector 192 of FIG. 28. A center female signal contact 204 receives center signal pin 194 for electrical connection upon assembly of the PCB connector 192 to the PCB 198. In this manner, the male portion of the electrical signal connector 194 is located on PCB connector 192, and the complementary, receiving female portion 204 is located internal to the PCB 198.

Figure 30:
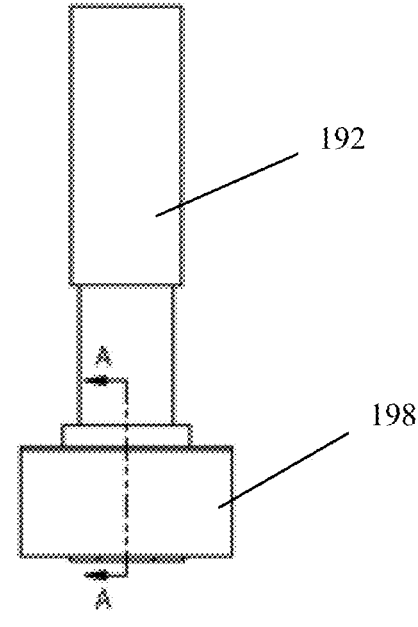
FIG. 30 depicts a side-view of a PCB connector of FIG. 28 attached to the PCB of FIG. 29.

FIG. 30 depicts a side-view of a PCB connector 192 of FIG. 28 attached to the PCB 198 of FIG. 29.

Figure 31:
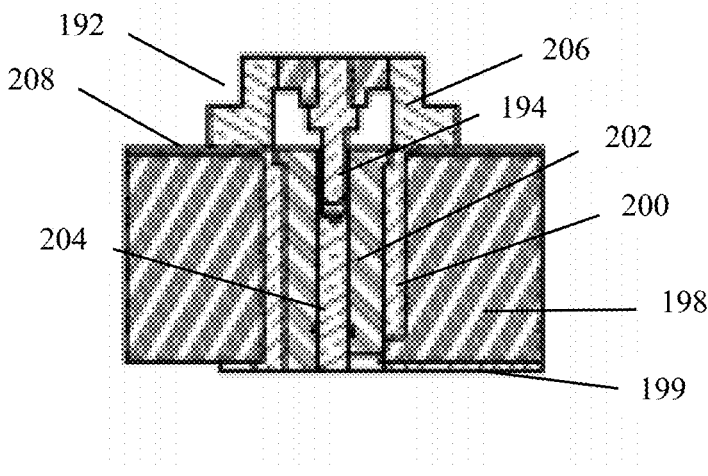
FIG. 31 is a partial cross-sectional view of the assembly of the PCB connector of FIG. 28 with the PCB of FIG. 29 as shown at section A-A.

FIG. 31 is a cross-sectional view of the attachment shown in FIG. 30 as shown at section A-A (ground prongs are not shown for clarity). An outer cylindrical footing 206 of PCB connector 192 mates with the top side 208 of PCB 198. Pin contact 194 is shown attached to the receiving female portion, signal center socket 204 within the via 200. In a similar fashion to the previous embodiments, the embodiment of FIG. 31 utilizes a slotted, conductive via body 200 coaxial with a slotted dielectric component 202, with a gap produced by the aligned slots such that a solder bridge or other conductive trace line 199 can make electrical connection with the signal center conductor 194.

The advantages of a vertical launch impedance matched via of the present invention include: a) maintaining impedance matching between the PCB connector and the PCB after installation; b) allowing for high frequency range capabilities; c) allowing for a vertical assembly configuration; d) allowing for through-hole soldering, thus creating a stronger bond between components and the PCB; e) increasing density of connections on the PCB; f) accommodating larger components that may undergo high power, high voltage, and mechanical stress, such as transformers, connectors, semiconductors, and electrolytic capacitors; and g) being capable of withstanding greater environmental stress.

The employment of the through-hole vertical launch impedance matched via of the present invention mitigates the lossy effects of PCB connections. A matched impedance is calculated and adjusted by configuring a via having a predetermined diameter, selected material and pin configuration, utilizing the impedance formula described below.

Figure 32:
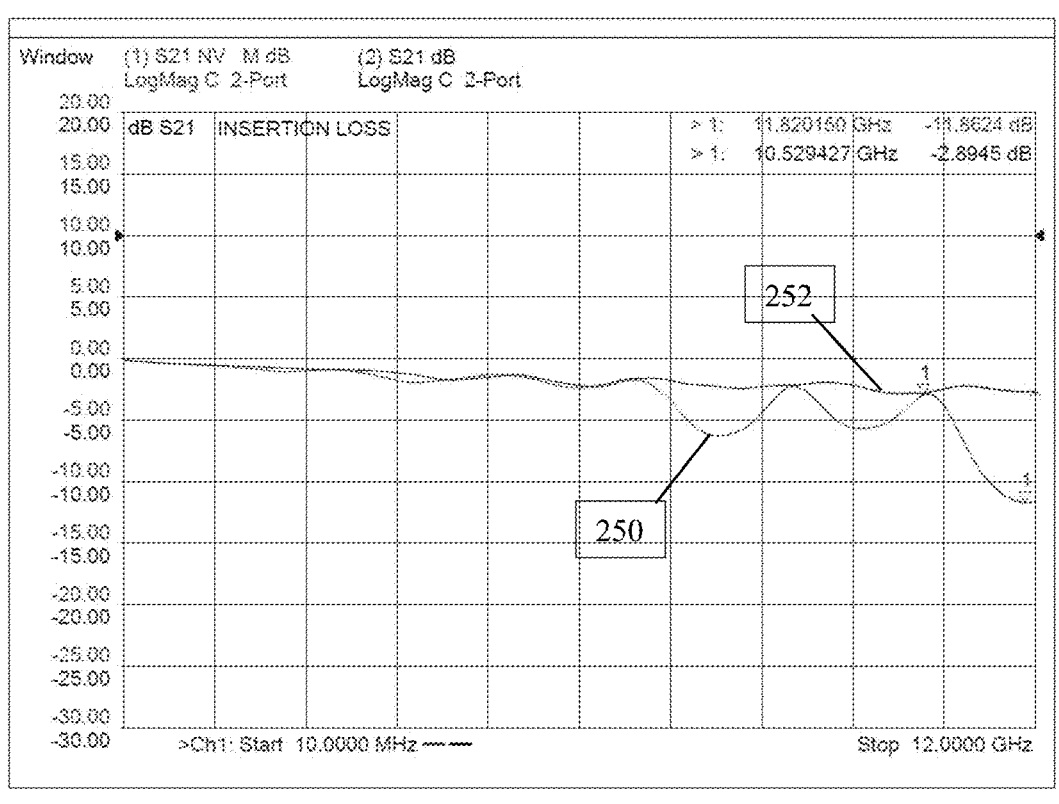
FIG. 32 is a graph of Insertion Loss vs. Frequency comparing connector-to-board interface performance in an impedance matched ground via to that of a traditional unmatched signal via.

Test results characterizing the improvement made to a signal when a proper 50-ohm impedance matched through-hole was used between a PCB connector and a PCB. Comparing the traces, there is a significance improvement in the loss performance of the circuit with the "matched" via after dielectric installation versus a soldered via without any dielectric present. Though, both circuits loss performance is similar at initial frequencies, the traditional signal via performance degrades with frequency. An empirically measured 10 dB loss performance improvement is seen after 11 GHz frequency when a matched via with dielectric is used. FIG. 32 is a graph of Insertion Loss vs. Frequency comparing the "matched" via after dielectric installation versus a soldered via without any dielectric present. The standard through-hole trace 250 shows much greater degradation after about 7 GHz against the "matched" via of the present invention 252.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. An apparatus for conducting an electrical signal between a first conductive strip of a printed circuit board and a printed circuit board connector, said apparatus comprising:

a via having a via body defining an inside wall, an outside wall, a top surface, and a bottom surface, wherein the inside wall forms a via body center through-hole, and wherein said via body includes an aperture or slot adjacent either the via body top surface or via body bottom surface, or said via body includes at least two apertures or slots, wherein a first aperture or slot is adjacent the via body top surface and a second aperture or slot is adjacent the via body bottom surface; and a dielectric component having a body defining a dielectric component inside wall, an outside wall, a top surface, and a bottom surface, said dielectric component body sized for slidable insertion within said via body center through-hole, said dielectric component body including a center through-hole coaxial with said via center through-hole, and wherein said dielectric component body includes an aperture or slot adjacent either the dielectric component top surface or dielectric component bottom surface, or said dielectric component body includes at least two apertures or slots, wherein a first dielectric component aperture or slot is adjacent the dielectric component top surface and a second dielectric component aperture or slot is adjacent the dielectric component bottom surface;

such that said via body aperture or slot is aligned with said dielectric component aperture or slot when said dielectric component is slidably inserted within said via center through-hole.

2. The apparatus of claim 1 wherein said via body aperture or slot comprises a gap or hole extending from said via body inside wall to said via body outside wall.

3. The apparatus of claim 1 wherein said dielectric component aperture or slot comprises a gap or hole extending from said dielectric component inside wall to said dielectric component outside wall, and into said dielectric component center aperture or through-hole.

4. The apparatus of claim 1 wherein said via body and said dielectric component are mounted within said printed circuit board.

5. The apparatus of claim 1 wherein said dielectric component includes a plurality of dielectric materials.

6. The apparatus of claim 1 wherein said via body is cylindrical having an outer diameter, and includes a ring on said via body bottom surface or said via body top surface or both, said ring having an outer diameter greater than said via body outer diameter, such that said ring extends beyond said via body outer diameter in a radial direction.

7. The apparatus of claim 6 wherein said ring includes an aperture or slot extending therethrough such that said ring aperture or slot is aligned with said via body aperture or slot.

8. The apparatus of claim 1 wherein said via body and said dielectric component are within said printed circuit board such that said via body top surface and said dielectric component top surface are approximately flush with a top surface of said printed circuit board.

9. The apparatus of claim 1 wherein said via body includes conductive material, such that said via body is capable carrying electrical current.

10. The apparatus of claim 9 wherein said via body is formed of a non-conductive material plated with said conductive material.

11. The apparatus of claim 1 wherein said via body center through-hole and said dielectric component center through-hole are coaxial and extend through said PCB.

12. The apparatus of claim 1 wherein said via body is fabricated during PCB fabrication on a layer-by-layer basis and/or said dielectric component is placed within said via body during said PCB fabrication.

13. The apparatus of claim 1 wherein said via body and said dielectric component are situated within said PCB such that top and bottom surfaces of said via body and said dielectric component are not exposed to both a top surface of said PCB and a bottom surface of said PCB.

14. The apparatus of claim 1 wherein said via body and said dielectric component are situated within said PCB such that a top surface of said via body and said dielectric component are not exposed to a top surface of said PCB, or a bottom surface of said via body and said dielectric component are not exposed to a bottom surface of said PCB.

15. The apparatus of claim 1 wherein said via body and said dielectric component are situated within said PCB such that top and bottom surfaces of said via body and said dielectric component are not exposed to either a top surface of said PCB or a bottom surface of said PCB, and including:

a second via having a second body defining a second inside wall, a second outside wall, a second top surface, and a second bottom surface, wherein the second inside wall forms a second via body center through-hole, and wherein said second via body includes an aperture or slot adjacent either the second via body top surface or second via body bottom surface, or said second via body includes at least two apertures or slots, wherein an upper aperture is adjacent the second via body second top surface and a lower aperture is adjacent the second via body second bottom surface; and a second via dielectric component having a second dielectric component body defining a second dielectric component inside wall, a second dielectric component outside wall, a second dielectric component top surface, and a second dielectric component bottom surface, said second dielectric component body sized for placement within said second via body center through-hole, said second dielectric component body including a center through-hole coaxial with said second via body center through-hole, and wherein said second dielectric component body includes an aperture or slot adjacent either the second dielectric component top surface or second dielectric component bottom surface, or said second dielectric component body includes at least two apertures or slots, wherein an upper dielectric component aperture or slot is adjacent the second dielectric component top surface and a lower dielectric component aperture or slot is adjacent the second dielectric component bottom surface;

such that said second via body apertures or slots are aligned with said second dielectric component apertures or slots when said second dielectric component is inserted within said second via body center through-hole; and wherein said second via body and said second dielectric component are situated within said PCB such that top and bottom surfaces of said second via body and said second dielectric component are not exposed to a top surface of said PCB or a bottom surface of said PCB.

16. A printed circuit board electrical connection assembly comprising:

a printed circuit board (PCB) having a top surface, a bottom surface, and an interior therebetween, wherein said PCB includes a signal line and a ground or zero potential contact or line;

a via insertable within or formed within said PCB, said via having a via body defining an inside wall, an outside wall, a top surface, and a bottom surface, wherein the inside wall forms a via center through-hole, and wherein said via body includes an aperture or slot adjacent either the via body top surface or via body bottom surface, or said via body includes at least two apertures or slots, wherein a first aperture is adjacent the via body top surface and a second aperture is adjacent the via body bottom surface, wherein said via body is conductive for transmitting electrical signals or for providing a ground or zero potential, wherein said via body extends into said PCB interior, and wherein said via body is cylindrical having an outer diameter, and includes a ring on said via body top or bottom surface, or both said top and bottom surface, said ring having an outer diameter greater than said via cylindrical body outer diameter, such that said ring extends beyond said via cylindrical body in a radial direction, and wherein said ring includes said via body aperture or slot extending therethrough such that said ring aperture or slot aligned with said via body aperture or slot; and a cylindrical dielectric component having a body defining a dielectric component inside wall, an outside wall, a top surface, and a bottom surface, said dielectric component body sized for placement within said via body center through-hole, said dielectric component body including a center through-hole coaxial with said via center through-hole, and wherein said dielectric component body includes an aperture or slot adjacent either the dielectric component top surface or dielectric component bottom surface, or said dielectric component body includes at least two apertures, wherein a first dielectric component aperture is adjacent the dielectric component top surface and a second dielectric component aperture is adjacent the dielectric component bottom surface, and wherein said dielectric component apertures align with said via body apertures when said cylindrical dielectric component is slidably inserted within said via body center through-hole; and a conductive trace and/or solder bridge formed on or within said PCB and traversing through said dielectric component aperture or slot and through said via body aperture or slot to said dielectric component center through-hole without making electrical contact with said via body.

17. The printed circuit board electrical connection assembly of claim 16 wherein said via apertures or slots extend from said via body inside wall to said via body outside wall.

18. The printed circuit board electrical connection assembly of claim 17 wherein said dielectric component apertures or slots extend from said dielectric component inside wall to said dielectric component outside wall, and into said dielectric component center aperture or through-hole.

19. The printed circuit board electrical connection assembly of claim 16 wherein said conductive trace and/or solder bridge extends through said ring aperture or slot.

20. The printed circuit board electrical connection assembly of claim 19 wherein said via is located within said printed circuit board interior, or extends from said printed circuit board top or bottom surface into said printed circuit board interior.

21. The printed circuit board electrical connection assembly of claim 16 wherein said dielectric component center through-hole includes a conductive member in electrical communication with said conductive trace and/or solder bridge.

22. The printed circuit board electrical connection assembly of claim 16 wherein said dielectric component conductive member includes a contact pin that extends beyond said dielectric body top surface.

23. The printed circuit board electrical connection assembly of claim 16 wherein said via body is cylindrical having an outer diameter, and includes a ring on said via body top or bottom surface, or both said top and bottom surface, said ring having an outer diameter greater than said via cylindrical body outer diameter, such that said ring extends beyond said via cylindrical body in a radial direction, and wherein said ring includes said via body aperture or slot extending therethrough such that said ring aperture or slot aligns with said via body aperture or slot.

24. The printed circuit board electrical connection assembly of claim 23 wherein said via is located within said printed circuit board interior, or extends from said printed circuit board top or bottom surface into said printed circuit board interior.

25. The printed circuit board electrical connection assembly of claim 16 wherein said via body top surface and said dielectric component top surface are approximately flush with said printed circuit board top surface.

26. The printed circuit board electrical connection assembly of claim 16 wherein said dielectric component conductive member includes an electrical pin socket that extends beyond said dielectric body top surface.

27. The printed circuit board electrical connection assembly of claim 26 wherein said via is located within said printed circuit board interior, or extends from said printed circuit board top or bottom surface into said printed circuit board interior.

28. The printed circuit board electrical connection assembly of claim 16 wherein said dielectric component conductive member includes an electrical pin socket that is approximately flush said dielectric component body top surface, and extends below said dielectric component top surface.

29. The printed circuit board electrical connection assembly of claim 28 wherein said via is located within said printed circuit board interior, or extends from said printed circuit board top or bottom surface into said printed circuit board interior.

30. The printed circuit board electrical connection assembly of claim 16 wherein said via is located entirely within said printed circuit board interior, or extends from said printed circuit board top or bottom surface into said printed circuit board interior.

* * * * *